(12) United States Patent
Bongiovi et al.

(10) Patent No.: US 9,413,321 B2
(45) Date of Patent: *Aug. 9, 2016

(54) SYSTEM AND METHOD FOR DIGITAL SIGNAL PROCESSING

(71) Applicant: Bongiovi Acoustics LLC, Port St. Lucie, FL (US)

(72) Inventors: Anthony Bongiovi, Port St. Lucie, FL (US); Glenn Zelniker, Gainesville, FL (US); Phillip Fuller, New York, NY (US); Ryan Copt, Port St. Lucie, FL (US)

(73) Assignee: Bongiovi Acoustics LLC, Port St. Lucie, FL (US)

( * ) Notice: Subject to any disclaimer, the term of this patent is extended or adjusted under 35 U.S.C. 154(b) by 156 days.

This patent is subject to a terminal disclaimer.

(21) Appl. No.: 14/138,701

(22) Filed: Dec. 23, 2013

(65) Prior Publication Data

US 2014/0112497 A1 Apr. 24, 2014

Related U.S. Application Data

(63) Continuation-in-part of application No. 13/826,194, filed on Mar. 14, 2013, now Pat. No. 9,276,542, which is a continuation of application No. 13/647,945, filed on Oct. 9, 2012, and a continuation of application No.

(Continued)

(51) Int. Cl.
*H03G 5/00* (2006.01)
*H03G 5/16* (2006.01)
*H04S 7/00* (2006.01)

(52) U.S. Cl.
CPC .............. *H03G 5/005* (2013.01); *H03G 5/165* (2013.01); *H04S 7/307* (2013.01)

(58) Field of Classification Search
CPC ......... H03G 5/005; H03G 5/165; H03G 3/20; H03G 9/005; H03G 9/18; H03G 7/007; H04R 3/00; H04S 7/307; H04S 7/30; H04S 2420/05; G10L 21/02; G10L 21/0232
USPC ................... 381/98, 106, 108, 320, 102, 104; 700/94
See application file for complete search history.

(56) References Cited

U.S. PATENT DOCUMENTS

| 3,795,876 A | 3/1974 | Takahashi et al. |
| 3,813,687 A | 5/1974 | Geil |

(Continued)

FOREIGN PATENT DOCUMENTS

| AU | 2005274099 | 10/2010 |
| AU | 20070325096 | 4/2012 |

(Continued)

OTHER PUBLICATIONS

NovaSound Int., http://www.novasoundint.com/new_page_t.htm, 2004.

*Primary Examiner* — Duc Nguyen
*Assistant Examiner* — Yogeshkumar Patel
(74) *Attorney, Agent, or Firm* — Malloy & Malloy, P.L.

(57) ABSTRACT

The present invention provides for methods and systems for digitally processing an audio signal to reproduce high quality sounds on various materials. In various embodiments, a method comprises filtering the signal with a low shelf filter and/or high shelf filter, passing the signal through a first compressor that, filtering the signal again with a low shelf filter and/or high shelf filter, processing the signal with a graphic equalizer based on a selected material profile, passing the signal through a second compressor, and outputting the signal to a transducer.

22 Claims, 16 Drawing Sheets

Related U.S. Application Data

13/443,627, filed on Apr. 10, 2012, said application No. 13/647,945 is a continuation of application No. 12/263,261, filed on Oct. 31, 2008, now Pat. No. 8,284,955, which is a continuation-in-part of application No. 11/947,301, filed on Nov. 29, 2007, now Pat. No. 8,160,274, and a continuation-in-part of application No. 11/703,216, filed on Feb. 7, 2007, now abandoned, said application No. 13/443,627 is a continuation-in-part of application No. 12/648,007, filed on Dec. 28, 2009, now Pat. No. 8,565,449, and a continuation-in-part of application No. 12/048,885, filed on Mar. 14, 2008, now Pat. No. 8,462,963, said application No. 12/648,007 is a continuation-in-part of application No. 11/947,301, said application No. 12/048,885 is a continuation-in-part of application No. 11/764,446, filed on Jun. 18, 2007, now Pat. No. 7,519,189, which is a continuation of application No. 10/914,234, filed on Aug. 10, 2004, now Pat. No. 7,254,243, said application No. 12/048,885 is a continuation-in-part of application No. 11/947,301.

(60) Provisional application No. 61/834,058, filed on Jun. 12, 2013, provisional application No. 60/861,711, filed on Nov. 30, 2006, provisional application No. 60/765,722, filed on Feb. 7, 2006.

(56) References Cited

U.S. PATENT DOCUMENTS

| | | |
|---|---|---|
| 4,162,462 A | 7/1979 | Endoh et al. |
| 4,184,047 A | 1/1980 | Langford |
| 4,218,950 A | 8/1980 | Uetrecht |
| 4,353,035 A | 10/1982 | Schroder |
| 4,356,558 A | 10/1982 | Owen et al. |
| 4,363,007 A | 12/1982 | Haramoto et al. |
| 4,412,100 A | 10/1983 | Orban |
| 4,517,415 A | 5/1985 | Laurence |
| 4,538,297 A | 8/1985 | Waller |
| 4,549,289 A | 10/1985 | Schwartz et al. |
| 4,584,700 A | 4/1986 | Scholz |
| 4,602,381 A | 7/1986 | Cugnini et al. |
| 4,612,665 A | 9/1986 | Inami et al. |
| 4,641,361 A | 2/1987 | Rosback |
| 4,677,645 A | 6/1987 | Kaniwa et al. |
| 4,696,044 A | 9/1987 | Waller, Jr. |
| 4,701,953 A | 10/1987 | White |
| 4,704,726 A | 11/1987 | Gibson |
| 4,739,514 A | 4/1988 | Short et al. |
| 4,815,142 A | 3/1989 | Imreh |
| 4,856,068 A | 8/1989 | Quatieri et al. |
| 4,887,299 A | 12/1989 | Cummins et al. |
| 5,073,936 A | 12/1991 | Görike et al. |
| 5,133,015 A | 7/1992 | Scholz |
| 5,210,806 A | 5/1993 | Kihara et al. |
| 5,239,997 A | 8/1993 | Guarino et al. |
| 5,361,381 A | 11/1994 | Short |
| 5,463,695 A | 10/1995 | Werrbach |
| 5,465,421 A | 11/1995 | McCormick et al. |
| 5,467,775 A | 11/1995 | Callahan et al. |
| 5,541,866 A | 7/1996 | Sato et al. |
| 5,572,443 A | 11/1996 | Emoto et al. |
| 5,617,480 A | 4/1997 | Ballard et al. |
| 5,640,685 A | 6/1997 | Komoda |
| 5,671,287 A | 9/1997 | Gerzon |
| 5,699,438 A | 12/1997 | Smith et al. |
| 5,727,074 A | 3/1998 | Hildebrand |
| 5,737,432 A | 4/1998 | Werrbach |
| 5,832,097 A | 11/1998 | Armstrong et al. |
| 5,848,164 A | 12/1998 | Levine |
| 5,872,852 A | 2/1999 | Dougherty |
| 5,990,955 A | 11/1999 | Koz |
| 6,078,670 A | 6/2000 | Beyer |
| 6,093,144 A | 7/2000 | Jaeger et al. |
| 6,108,431 A | 8/2000 | Bachler |
| 6,201,873 B1 | 3/2001 | Dal Farra |
| 6,263,354 B1 | 7/2001 | Gandhi |
| 6,285,767 B1 | 9/2001 | Klayman |
| 6,292,511 B1 | 9/2001 | Goldston et al. |
| 6,317,117 B1 | 11/2001 | Goff |
| 6,318,797 B1 | 11/2001 | Bohm et al. |
| 6,518,852 B1 | 2/2003 | Derrick |
| 6,535,846 B1 | 3/2003 | Shashoua |
| 6,661,897 B2 | 12/2003 | Smith |
| 6,661,900 B1 | 12/2003 | Allred et al. |
| 6,772,114 B1 | 8/2004 | Sluijter et al. |
| 6,847,258 B2 | 1/2005 | Ishida et al. |
| 6,871,525 B2 | 3/2005 | Withnall et al. |
| 6,907,391 B2 | 6/2005 | Bellora et al. |
| 6,999,826 B1 | 2/2006 | Zhou et al. |
| 7,006,653 B2 | 2/2006 | Guenther |
| 7,016,746 B2 | 3/2006 | Wiser et al. |
| 7,024,001 B1 | 4/2006 | Nakada |
| 7,058,463 B1 | 6/2006 | Ruha et al. |
| 7,123,728 B2 | 10/2006 | King et al. |
| 7,254,243 B2 | 8/2007 | Bongiovi |
| 7,266,205 B2 | 9/2007 | Miller |
| 7,274,795 B2 | 9/2007 | Bongiovi |
| 7,519,189 B2 | 4/2009 | Bongiovi |
| 7,577,263 B2 | 8/2009 | Tourwe |
| 7,613,314 B2 | 11/2009 | Camp, Jr. |
| 7,676,048 B2 | 3/2010 | Tsutsui |
| 7,711,442 B2 | 5/2010 | Ryle et al. |
| 7,778,718 B2 | 8/2010 | Janke et al. |
| 7,916,876 B1 | 3/2011 | Helsloot |
| 8,068,621 B2 | 11/2011 | Okabayashi et al. |
| 8,160,274 B2 * | 4/2012 | Bongiovi .............. H04R 1/005 381/100 |
| 8,175,287 B2 | 5/2012 | Ueno et al. |
| 8,229,136 B2 | 7/2012 | Bongiovi |
| 8,284,955 B2 | 10/2012 | Bonglovi et al. |
| 8,462,963 B2 | 6/2013 | Bongiovi |
| 8,472,642 B2 | 6/2013 | Bongiovi |
| 8,565,449 B2 | 10/2013 | Bongiovi |
| 8,705,765 B2 | 4/2014 | Bongiovi |
| 8,879,743 B1 | 11/2014 | Mitra |
| 2001/0008535 A1 | 7/2001 | Lanigan |
| 2001/0043704 A1 | 11/2001 | Schwartz |
| 2002/0057808 A1 | 5/2002 | Goldstein |
| 2003/0023429 A1 | 1/2003 | Claesson |
| 2003/0035555 A1 | 2/2003 | King et al. |
| 2003/0043940 A1 | 3/2003 | Janky et al. |
| 2003/0112088 A1 | 6/2003 | Bizjak |
| 2003/0138117 A1 | 7/2003 | Goff |
| 2003/0142841 A1 | 7/2003 | Wiegand |
| 2003/0164546 A1 | 9/2003 | Giger |
| 2003/0179891 A1 | 9/2003 | Rabinowitz et al. |
| 2003/0216907 A1 | 11/2003 | Thomas |
| 2004/0022400 A1 | 2/2004 | Magrath |
| 2004/0044804 A1 | 3/2004 | Mac Farlane |
| 2004/0086144 A1 | 5/2004 | Kallen |
| 2004/0138769 A1 | 7/2004 | Akiho |
| 2004/0146170 A1 | 7/2004 | Zint |
| 2005/0090295 A1 | 4/2005 | Ali et al. |
| 2005/0117771 A1 | 6/2005 | Vosburgh et al. |
| 2005/0129248 A1 | 6/2005 | Kraemer et al. |
| 2005/0175185 A1 | 8/2005 | Korner |
| 2005/0201572 A1 | 9/2005 | Lindahl et al. |
| 2005/0249272 A1 | 11/2005 | Kirkeby et al. |
| 2005/0254564 A1 | 11/2005 | Tsutsui |
| 2006/0034467 A1 | 2/2006 | Sleboda et al. |
| 2006/0064301 A1 | 3/2006 | Aguilar et al. |
| 2006/0098827 A1 * | 5/2006 | Paddock ................ G10L 21/02 371/106 |
| 2006/0126851 A1 | 6/2006 | Yuen et al. |
| 2006/0126865 A1 | 6/2006 | Blamey et al. |
| 2006/0138285 A1 | 6/2006 | Oleski et al. |
| 2006/0140319 A1 | 6/2006 | Eldredge et al. |
| 2006/0189841 A1 | 8/2006 | Pluvinage |
| 2006/0291670 A1 | 12/2006 | King et al. |
| 2007/0010132 A1 | 1/2007 | Nelson |

(56) References Cited

U.S. PATENT DOCUMENTS

| | | |
|---|---|---|
| 2007/0173990 A1 | 7/2007 | Smith et al. |
| 2007/0177459 A1 | 8/2007 | Behn |
| 2007/0206643 A1 | 9/2007 | Egan |
| 2007/0223713 A1 | 9/2007 | Gunness |
| 2007/0223717 A1 | 9/2007 | Boersma |
| 2007/0253577 A1 | 11/2007 | Yen et al. |
| 2008/0031462 A1 | 2/2008 | Walsh et al. |
| 2008/0040116 A1 | 2/2008 | Cronin |
| 2008/0069385 A1 | 3/2008 | Revit |
| 2008/0112576 A1 | 5/2008 | Bongiovi |
| 2008/0123870 A1 | 5/2008 | Stark |
| 2008/0123873 A1 | 5/2008 | Bjorn-Josefsen et al. |
| 2008/0137881 A1 | 6/2008 | Bongiovi |
| 2008/0165989 A1 | 7/2008 | Seil et al. |
| 2008/0181424 A1 | 7/2008 | Schulein et al. |
| 2008/0219459 A1 | 9/2008 | Bongiovi et al. |
| 2008/0255855 A1 | 10/2008 | Lee et al. |
| 2009/0022328 A1 | 1/2009 | Neugebauer et al. |
| 2009/0054109 A1 | 2/2009 | Hunt |
| 2009/0062946 A1 | 3/2009 | Bongiovi et al. |
| 2009/0086996 A1* | 4/2009 | Bongiovi ............... H03G 7/007 381/106 |
| 2009/0290725 A1 | 11/2009 | Huang |
| 2009/0296959 A1 | 12/2009 | Bongiovi |
| 2010/0166222 A1 | 7/2010 | Bongiovi |
| 2010/0256843 A1 | 10/2010 | Bergstein et al. |
| 2010/0278364 A1 | 11/2010 | Berg |
| 2010/0303278 A1 | 12/2010 | Sahyoun |
| 2011/0013736 A1 | 1/2011 | Tsukamoto et al. |
| 2011/0087346 A1 | 4/2011 | Larsen et al. |
| 2011/0194712 A1 | 8/2011 | Potard |
| 2011/0230137 A1 | 9/2011 | Hicks et al. |
| 2011/0257833 A1 | 10/2011 | Trush et al. |
| 2012/0014553 A1 | 1/2012 | Bonanno |
| 2012/0099741 A1 | 4/2012 | Gotoh et al. |
| 2012/0170759 A1 | 7/2012 | Yuen et al. |
| 2012/0213034 A1 | 8/2012 | Imran |
| 2012/0213375 A1 | 8/2012 | Mahabub et al. |
| 2012/0302920 A1 | 11/2012 | Bridger et al. |
| 2013/0121507 A1 | 5/2013 | Bongiovi et al. |
| 2013/0162908 A1 | 6/2013 | Son et al. |
| 2013/0169779 A1 | 7/2013 | Pedersen |
| 2013/0227631 A1 | 8/2013 | Sharma et al. |
| 2013/0242191 A1 | 9/2013 | Leyendecker et al. |
| 2013/0288596 A1 | 10/2013 | Suzuki et al. |
| 2013/0338504 A1 | 12/2013 | Demos et al. |
| 2014/0100682 A1 | 4/2014 | Bongiovi |
| 2014/0112497 A1 | 4/2014 | Bongiovi |
| 2014/0153765 A1 | 6/2014 | Gan et al. |
| 2014/0185829 A1 | 7/2014 | Bongiovi |
| 2014/0369504 A1 | 12/2014 | Bongiovi et al. |
| 2014/0379355 A1 | 12/2014 | Hosokawsa |
| 2015/0215720 A1 | 7/2015 | Carroll |

FOREIGN PATENT DOCUMENTS

| | | |
|---|---|---|
| AU | 2012202127 | 7/2014 |
| CA | 2533221 | 6/1995 |
| CA | 2576829 | 7/2014 |
| CN | 0780050323X | 5/2013 |
| CN | 203057339 | 7/2013 |
| EP | 0206746 B1 | 8/1992 |
| GB | 2003707 A | 3/1979 |
| ID | P0031074 | 6/2012 |
| IN | 260362 | 4/2014 |
| IS | 198914 | 7/2014 |
| JP | 3150910 | 6/1991 |
| JP | 7106876 | 4/1995 |
| JP | 1020040022442 | 3/2004 |
| JP | 2005500768 | 1/2005 |
| JP | 1020090101209 | 9/2009 |
| JP | 4787255 | 7/2011 |
| JP | 5048782 | 7/2012 |
| JP | 201543561 | 3/2015 |
| KR | 1020040022442 | 3/2004 |
| KR | 1020090101209 | 9/2009 |
| KR | 101503541 | 3/2015 |
| MO | J001182 | 10/2013 |
| MX | 274143 | 8/2005 |
| MX | 301172 | 11/2006 |
| MX | 315197 | 11/2013 |
| NZ | 553744 | 1/2009 |
| NZ | 574141 | 4/2010 |
| NZ | 557201 | 5/2012 |
| PH | 12009501073 | 11/2014 |
| RU | 2407142 | 12/2010 |
| RU | 2483363 | 5/2013 |
| SG | 152762 | 12/2011 |
| SG | 155213 | 2/2013 |
| SU | 1319288 | 6/1987 |
| WO | WO 9311637 | 6/1993 |
| WO | WO 9535628 | 12/1995 |
| WO | WO 9938155 | 7/1999 |
| WO | WO 0015003 | 3/2000 |
| WO | WO 03104924 | 12/2003 |
| WO | WO 2006020427 | 2/2006 |
| WO | WO 2007092420 | 8/2007 |
| WO | WO 2008067454 | 6/2008 |
| WO | WO 2009070797 | 6/2009 |
| WO | WO 2009114746 | 9/2009 |
| WO | WO 2009155057 | 12/2009 |
| WO | WO 2010027705 | 3/2010 |
| WO | WO 2010051354 | 5/2010 |
| WO | WO 2011081965 | 7/2011 |
| WO | WO2013/055394 A1 | 4/2013 |
| WO | WO 2013076223 | 5/2013 |
| WO | WO2014/201103 A1 | 12/2014 |
| WO | WO 2015061393 | 4/2015 |
| WO | WO 2015077681 | 5/2015 |

* cited by examiner

DIRECT FORM TYPE 1 IMPLEMENTATION OF 2ND-ORDER TRANSFER FUNCTION

DIRECT FORM TYPE 1 IMPLEMENTATION OF 2ND-ORDER TRANSFER FUNCTION

SYSTEM AND METHOD FOR DIGITAL SIGNAL PROCESSING

CROSS-REFERENCE TO RELATED APPLICATIONS

This application claims the benefit of U.S. Provisional patent application having Ser. No. 61/834,058, filed Jun. 12, 2013.

This application is also a continuation-in-part of U.S. patent application having Ser. No. 13/826,194, filed on Mar. 14, 2013, which is a continuation application of: (1) U.S. patent application having Ser. No. 13/647,945 filed on Oct. 9, 2012, and (2) U.S. patent application having Ser. No. 13/443,627, filed on Apr. 10, 2012.

Further, U.S. patent application Ser. No. 13/647,945 filed on Oct. 9, 2012 is a continuation of U.S. patent application Ser. No. 12/263,261 filed on Oct. 31, 2008 (now U.S. Pat. No. 8,284,955), which is a continuation-in-part of U.S. patent application Ser. No. 11/947,301, now U.S. Pat. No. 8,160,274, which claims priority to U.S. Provisional Application No. 60/861,711 filed on Nov. 30, 2006, and which is a continuation-in-part of U.S. application Ser. No. 11/703,216, filed on Feb. 7, 2007, which claims priority to U.S. Provisional Application No. 60/765,722, filed Feb. 7, 2006).

Further still, U.S. patent application Ser. No. 13/443,627, filed on Apr. 10, 2012, is a continuation-in-part of: (1) U.S. patent application Ser. No. 12/648,007 filed on Dec. 28, 2009 and (2) U.S. patent application Ser. No. 12/048,885 filed on Mar. 14, 2008.

U.S. patent application Ser. No. 12/648,007 filed on Dec. 28, 2009 is a continuation-in-part of U.S. application Ser. No. 11/947,301, filed Nov. 29, 2007, which claims priority to U.S. Provisional Application No. 60/861,711 filed Nov. 30, 2006, and which is a continuation-in-part of U.S. application Ser. No. 11/703,216, filed Feb. 7, 2007, which claims priority to U.S. Provisional Application No. 60/765,722, filed Feb. 7, 2006.

U.S. patent application Ser. No. 12/048,885 filed on Mar. 14, 2008 is a continuation-in-part of application Ser. No. 11/764,446 filed on Jun. 18, 2007 (now U.S. Pat. No. 7,519,189), which is a continuation of application Ser. No. 10/914,234 filed on Aug. 10, 2004 (now U.S. Pat. No. 7,254,243), and which is a continuation-in-part of application Ser. No. 11/947,301 filed on Nov. 29, 2007, which is a continuation-in-part of application Ser. No. 11/703,216 filed on Feb. 7, 2007.

Each of the above applications is incorporated by reference herein in their entirety.

FIELD OF THE INVENTION

The present invention provides for methods and systems for digitally processing an audio signal. Specifically, some embodiments relate to digitally processing an audio signal in a manner such that studio-quality sound can be reproduced across the entire spectrum of audio devices. In addition, some embodiments are directed to systems and methods for reproducing high quality sounds on various materials through transducers that are not loudspeakers.

BACKGROUND OF THE INVENTION

Historically, studio-quality sound, which can best be described as the full reproduction of the complete range of audio frequencies that are utilized during the studio recording process, has only been able to be achieved, appropriately, in audio recording studios. Studio-quality sound is characterized by the level of clarity and brightness which is attained only when the upper-mid frequency ranges are effectively manipulated and reproduced. While the technical underpinnings of studio-quality sound can be fully appreciated only by experienced record producers, the average listener can easily hear the difference that studio-quality sound makes.

While various attempts have been made to reproduce studio-quality sound outside of the recording studio, those attempts have come at tremendous expense (usually resulting from advanced speaker design, costly hardware, and increased power amplification) and have achieved only mixed results. Thus, there exists a need for a process whereby studio-quality sound can be reproduced outside of the studio with consistent, high quality, results at a low cost. There exists a further need for audio devices embodying such a process, as well as computer chips embodying such a process that may be embedded within audio devices or located in a device separate from and not embedded within the audio devices and, in one embodiment, located as a stand-alone device between the audio device and its speakers. There also exists a need for the ability to produce studio-quality sound through inexpensive speakers.

In cellular telephones, little has been done to enhance and optimize the audio quality of the voice during a conversation or of audio programming during playback. Manufacturers have, in some cases, attempted to enhance the audio, but generally this is accomplished utilizing the volume control of the device. The general clarity of the voice 'sound' remains fixed. The voice is merely amplified and/or equalized. Moreover, the settings for amplification and/or equalization are also fixed and cannot be altered by the user.

Further, the design of audio systems for vehicles involves the consideration of many different factors. The audio system designer selects the position and number of speakers in the vehicle. The desired frequency response of each speaker must also be determined. For example, the desired frequency response of a speaker that is located on the instrument panel may be different than the desired frequency response of a speaker that is located on the lower portion of the rear door panel.

The audio system designer must also consider how equipment variations impact the audio system. For example, an audio system in a convertible may not sound as good as the same audio system in the same model vehicle that is a hard top. The audio system options for the vehicle may also vary significantly. One audio option for the vehicle may include a basic 4-speaker system with 40 watts amplification per channel while another audio option may include a 12-speaker system with 200 watts amplification per channel. The audio system designer must consider all of these configurations when designing the audio system for the vehicle. For these reasons, the design of audio systems is time consuming and costly. The audio system designers must also have a relatively extensive background in signal processing and equalization.

Furthermore, in broadcast or audio transmission applications, it would be beneficial to have a split or shared processing system whereby the audio signal is at least partially processed prior to transmission, and upon receipt of the transmitted signal, the signal is further processed to create an output signal. The output signal, in various embodiments, may be specifically tailored to the output environment, output audio device, etc. In particular, this scheme has the advantage of combining dynamic range control, noise reduction and audio enhancement into a single system, where audio processing duties are shared by the encoding and decoding sides.

SUMMARY OF THE INVENTION

The present invention meets the existing needs described above by providing for a method of digitally processing an audio signal in a manner such that studio-quality sound can be reproduced across the entire spectrum of audio devices. The present invention also provides for a computer chip that can digitally process an audio signal in such a manner, and provides for audio devices that comprise such a chip.

The present invention further meets the above stated needs by allowing inexpensive speakers to be used in the reproduction of studio-quality sound. Furthermore, the present invention meets the existing needs described above by providing for a mobile audio device that can be used in a vehicle to reproduce studio-quality sound using the vehicle's existing speaker system by digitally manipulating audio signals. Indeed, even the vehicle's factory-installed speakers can be used to achieve studio-quality sound using the present invention.

In one embodiment, the present invention provides for a method comprising the steps of inputting an audio signal, adjusting the gain of that audio signal a first time, processing that signal with a first low shelf filter, processing that signal with a first high shelf filter, processing that signal with a first compressor, processing that signal with a second low shelf filter, processing that signal with a second high shelf filter, processing that signal with a graphic equalizer, processing that signal with a second compressor, and adjusting the gain of that audio signal a second time. In this embodiment, the audio signal is manipulated such that studio-quality sound is produced. Further, this embodiment compensates for any inherent volume differences that may exist between audio sources or program material, and produces a constant output level of rich, full sound.

This embodiment also allows the studio-quality sound to be reproduced in high-noise environments, such as moving automobiles. Some embodiments of the present invention allow studio-quality sound to be reproduced in any environment. This includes environments that are well designed with respect to acoustics, such as, without limitation, a concert hall. This also includes environments that are poorly designed with respect to acoustics, such as, without limitation, a traditional living room, the interior of vehicles and the like. Further, some embodiments of the present invention allow the reproduction of studio-quality sound irrespective of the quality of the electronic components and speakers used in association with the present invention. Thus, the present invention can be used to reproduce studio-quality sound with both top-of-the-line and bottom-of-the-line electronics and speakers, and with everything in between.

In some embodiments, the present invention may be used for playing music, movies, or video games in high-noise environments such as, without limitation, an automobile, airplane, boat, club, theatre, amusement park, or shopping center. Furthermore, in some embodiments, the present invention seeks to improve sound presentation by processing an audio signal outside the efficiency range of both the human ear and audio transducers which is between approximately 600 Hz and approximately 1,000 Hz. By processing audio outside this range, a fuller and broader presentation may be obtained.

In some embodiments, the bass portion of the audio signal may be reduced before compression and enhanced after compression, thus ensuring that the sound presented to the speakers has a spectrum rich in bass tones and free of the muffling effects encountered with conventional compression. Furthermore, in some embodiments, as the dynamic range of the audio signal has been reduced by compression, the resulting output may be presented within a limited volume range. For example, the present invention may comfortably present studio-quality sound in a high-noise environment with an 80 dB noise floor and a 110 dB sound threshold.

In some embodiments, the method specified above may be combined with other digital signal processing methods that are performed before the above-recited method, after the above-recited method, or intermittently with the above-recited method.

In another specific embodiment, the present invention provides for a computer chip that may perform the method specified above. In one embodiment, the computer chip may be a digital signal processor, or DSP. In other embodiments, the computer chip may be any processor capable of performing the above-stated method, such as, without limitation, a computer, computer software, an electrical circuit, an electrical chip programmed to perform these steps, or any other means to perform the method described.

In another embodiment, the present invention provides for an audio device that comprises such a computer chip. The audio device may comprise, for example and without limitation: a radio; a CD player; a tape player; an MP3 player; a cell phone; a television; a computer; a public address system; a game station such as a Playstation 3 (Sony Corporation—Tokyo, Japan), an X-Box 360 (Microsoft Corporation—Redmond, Wash.), or a Nintendo Wii (Nintendo Co., Ltd. Kyoto, Japan); a home theater system; a DVD player; a video cassette player; or a Blu-Ray player.

In such an embodiment, the chip of the present invention may be delivered the audio signal after it passes through the source selector and before it reaches the volume control. Specifically, in some embodiments the chip of the present invention, located in the audio device, processes audio signals from one or more sources including, without limitation, radios, CD players, tape players, DVD players, and the like. The output of the chip of the present invention may drive other signal processing modules or speakers, in which case signal amplification is often employed.

Specifically, in one embodiment, the present invention provides for a mobile audio device that comprises such a computer chip. Such a mobile audio device may be placed in an automobile, and may comprise, for example and without limitation, a radio, a CD player, a tape player, an MP3 player, a DVD player, or a video cassette player.

In this embodiment, the mobile audio device of the present invention may be specifically tuned to each vehicle in which it may be used in order to obtain optimum performance and to account for unique acoustic properties in each vehicle such as speaker placement, passenger compartment design, and background noise. Also in this embodiment, the mobile audio device of the present invention may provide precision tuning for all 4 independently controlled channels. Also in this embodiment, the mobile audio device of the present invention may deliver 10 or more watts of power. Also in this embodiment, the mobile audio device of the present invention may use the vehicle's existing (sometimes factory-installed) speaker system to produce studio-quality sound. Also in this embodiment, the mobile audio device of the present invention may comprise a USB port to allow songs in standard digital formats to be played. Also in this embodiment, the mobile audio device of the present invention may comprise an adapter for use with satellite radio. Also in this embodiment, the mobile audio device of the present invention may comprise an adaptor for use with existing digital audio playback devices such as, without limitation, MP3 players. Also in this embodiment, the mobile audio device of the present invention may comprise a remote control. Also in this embodiment, the mobile audio device of the present invention may comprise a detachable faceplate.

In various embodiments, a method comprises receiving a profile comprising a plurality of filter equalizing coefficients, configuring a plurality of filters of a graphic equalizer with the plurality of filter equalizing coefficients from the profile, receiving a first signal for processing, adjusting the plurality of filters using a first gain, equalizing the first signal using the plurality of filters of the graphic equalizer, outputting the first signal, receiving a second signal for processing, adjusting the plurality of filters, previously configured with the filter equalizing coefficients from the profile, using a second gain, equalizing the second plurality of frequencies of the second signal with the plurality of filters of the graphic equalizer, and outputting the second signal. The profile may be received from a communication network and/or from firmware.

The plurality of filters may be configured using the plurality of filter equalizing coefficients to modify the first signal to clarify a sound of a voice during a telephone communication, to modify the first signal to clarify a sound of a voice in a high noise environment, and/or to modify the first signal to adjust a sound associated with a media file for a handheld device.

Prior to equalizing the first signal, the method may further comprise adjusting a gain of the first signal, filtering the adjusted first signal with a low shelf filter, and compressing the filtered first signal with a compressor. Further, the method may comprise, after equalizing the first signal, compressing the equalized first signal with a compressor, and adjusting the gain of the compressed first signal.

In some embodiments, the method further comprises filtering the first signal with a first low filter, filtering the first signal received from the first low shelf filter with a first high shelf filter prior to compressing the filtered signal with a compressor, filtering the first signal with a second low shelf filter prior to equalizing the first signal with the graphic equalizer, and filtering the first signal with a second high shelf filter after the first signal is filtered with the second low shelf filter. In at least one embodiment, the first low shelf filter and first high shelf filter are configured to create an approximate 24 dB differential between high and low frequencies.

In some embodiments, the digital signal represents an audio signal that can be received wirelessly, e.g. to allow for more freedom of motion for the listener when compared to wired embodiments. This signal may be input into a personal audio listening device, such as a pair of headphones and these headphones may be coupled to a driver circuit. Additionally, various embodiments create a sound profile for a vehicle where the personal audio listening device will be used.

Some embodiments adjust the gain of the received signal a first time with a first gain amplifier and adjust the gain of the signal a second time with a second gain amplifier. Various cutoff frequencies may be used. For example, the first low shelf filter may have a cutoff frequency at 1000 Hz and the first high shelf filter may have a cutoff frequency at 1000 Hz. In some examples, the graphic equalizer comprises eleven cascading second order filters. Each of the second order filters can be a bell filter. In some embodiments, the first of the eleven filters has a center frequency of 30 Hz and the eleventh filter of the eleven filters has a center frequency of 16000 Hz. The second to tenth filters may be centered at approximately one-octave intervals from each other. In various embodiments, the second low shelf filter is a magnitude-complementary low-shelf filter.

In some embodiments, an audio system comprises a personal audio listening device, such as an audio headset. The embodiment might also include a digital processing device coupled to the headset. The digital processor device may include a first gain amplifier configured to amplify a signal, a first low shelf filter configured to filter the amplified signal and a first compressor configured to compress the filtered signal. Various embodiments may include a graphic equalizer configured to process the filtered signal, a second compressor configured to compress the processed signal with a second compressor, and a second gain amplifier configured to amplify the gain of the compressed signal and to output an output signal. The audio system may further comprise a headset driver coupled to an output of the digital processing device and configured to drive the headset such that it emits sound.

The audio system may also include a first high shelf filter configured to filter the signal received from the first low shelf filter prior to compressing the filtered signal with the first compressor. A second low shelf filter configured to filter a received signal prior to processing the received signal with the graphic equalizer; and a second high shelf filter configured to filter a received signal after the received signal is filtered with the second low shelf filter may also be included.

Some embodiments include a wireless receiver configured to receive audio signals wirelessly from a transmitter. In various embodiments, the audio system further comprises profile generation circuitry configured to allow a user to create a sound profile for an area by listening to music in the area and adjusting the audio system. A second low shelf filter that is a magnitude-complementary low-shelf filter may also be used to filter the audio signal.

In some embodiments of the methods and systems described herein process an audio signal. This can be done by receiving an audio signal, adjusting a gain of the audio signal a first time using a separate digital processing device located between a radio head unit and a speaker, and processing the audio signal with a first low shelf filter using the digital processing device. Various embodiments process the audio signal with a first high shelf filter using the digital processing device, process the audio signal with a first compressor using the digital processing device, and process the audio signal with a second low shelf filter using the digital processing device. These embodiments may also process the audio signal with a second high shelf filter using the digital processing device, process the audio signal with a graphic equalizer using the digital processing device, process the audio signal with a second compressor using the digital processing device. Additionally, these embodiments may adjust the gain of the audio signal a second time using the digital processing device and output the audio signal from the digital processing device to a headset driver. Various embodiments may connect the driver to a set of headphones, profile for a vehicle where the headphones will be used and receive the audio signal wirelessly.

The plurality of filters of the graphic equalizer may comprise eleven cascading second order filters. Each of the second order filters may be bell filters.

In some embodiments, a system comprises a graphic equalizer. The graphic equalizer may comprise a filter module, a profile module, and an equalizing module. The filter module comprises a plurality of filters. The profile module may be configured to receive a profile comprising a plurality of filter equalizing coefficients. The equalizing module may be configured to configure the plurality of filters with the plurality of filter equalizing coefficients from the profile, to receive first and second signals, to adjust the plurality of filters using a first gain, to equalize the first plurality using the plurality of filters of the graphic equalizer, to output the first signal, to adjust the plurality of filters, previously configured with the filter equalizing coefficients from the profile, using a second gain, to equalize the second signal using the plurality of filters of the graphic equalizer, and to output the second signal.

In various embodiments, a method comprises configuring a graphic equalizer with a plurality of filter equalizing coefficients, adjusting the graphic equalizer using a first gain, processing the first signal with the graphic equalizer, outputting the first signal from the graphic equalizer, adjusting the graphic equalizer using a second gain, processing the second signal with the graphic equalizer, the graphic equalizer being previously configured with the plurality of filter equalizing coefficients, and outputting the second signal from the graphic equalizer.

In some embodiments, a computer readable medium may comprise executable instructions. The instructions may be executable by a processor for performing a method. The method may comprise receiving a profile comprising a plurality of filter equalizing coefficients, configuring a plurality of filters of a graphic equalizer using the plurality of filter equalizing coefficients from the profile, receiving a first signal for processing, adjusting the plurality of filters using a first gain, equalizing the first signal using the plurality of filters of the graphic equalizer, outputting the first signal, receiving a second signal for processing, adjusting the plurality of filters, previously configured using the filter coefficients from the profile, using a second gain, equalizing the second plurality of frequencies of the second signal with the plurality of filters of the graphic equalizer, and outputting the second signal.

In yet another embodiment of the present invention, the system and/or method is configured for broadcasting or transmission applications, whereby processing of the audio signal is shared between a pre-transmission processing module and a post-transmission processing module. Specifically, in certain embodiments, the audio signal may be broadcasted or transmitted to one or more receiving audio devices which will, in turn, play the audio signal. In particular, the broadcast or transmission may, in certain applications, be long range, such as, for example, via radio signal transmission or radio broadcast. In other embodiments, the transmission may be short range, such as, for example, within a common studio, concert hall, automobile, etc.

In either example, the processing of the audio signal begins at the pre-transmission processing module, prior to transmission or broadcast, and ends at the post-transmission processing module, which in certain embodiments, is located at the audio device such as the receiving radio, speakers, speaker system, loudspeaker, cellular telephone, etc.

This scheme has the advantage of combining dynamic range control, noise reduction and audio enhancement into a single, lightweight system where audio processing duties are shared by the encoding/transmitting (pre-transmission) and decoding/receiving (post-transmission) sides. The final frequency response of the system may be substantially flat, even during heavy automatic gain control on the encoding (pre-transmission) side. The resultant audio signal is, in most embodiments, more efficient than the source and can be tailored to the specific listening environment. Furthermore, the post-transmission processing module may be configured to equalize the signal in an aggressive manner to compensate for deficiencies in the playback system or environment, due at least in part to the controlling of the dynamic range via the pre-transmission processing module.

In another embodiment, the output signal of the present invention may be sent to a transducer for vibrating materials, e.g. surfaces including but not limited to appliances, walls, furniture, windows. The transducer contemplated is not a loudspeaker. Select frequencies of the signal will be gain adjusted based at least in part on a material profile. The material profile may comprise the material type, area, density, rigidity, and any other characteristics determinative of its acoustic resonance. A graphic equalizer or other appropriate device may be employed to adjust frequency-specific gains based on a material profile. The material profile may be received by the profile module. The frequency-specific gain adjustment may also be performed by the post processing module in a broadcasting embodiment.

Other features and aspects of the invention will become apparent from the following detailed description, taken in conjunction with the accompanying drawings, which illustrate, by way of example, the features in accordance with embodiments of the invention. The summary is not intended to limit the scope of the invention, which is defined solely by the claims attached hereto.

BRIEF DESCRIPTION OF THE DRAWINGS

The present invention, in accordance with one or more various embodiments, is described in detail with reference to the following figures. The drawings are provided for purposes of illustration only and merely depict typical or example embodiments of the invention. These drawings are provided to facilitate the reader's understanding of the invention and shall not be considered limiting of the breadth, scope, or applicability of the invention. It should be noted that for clarity and ease of illustration these drawings are not necessarily made to scale.

Figure 1:
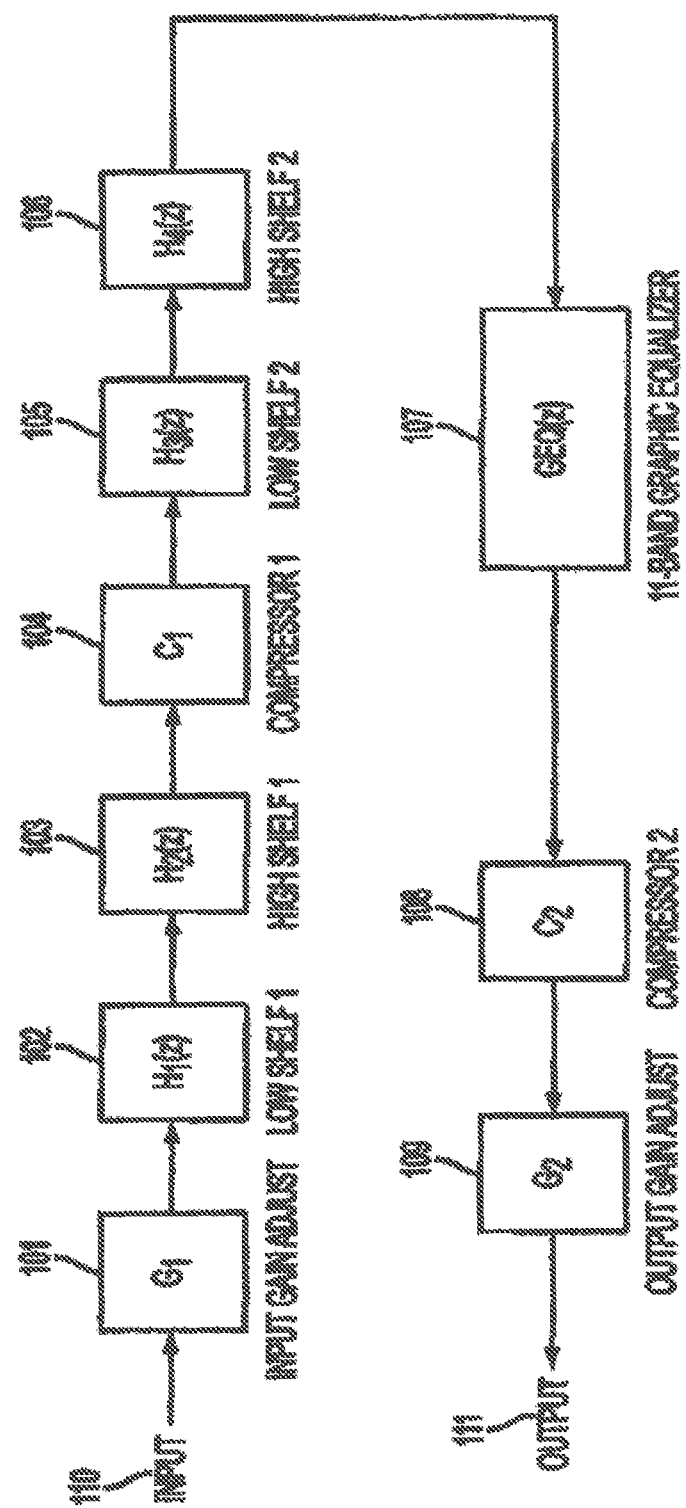
FIG. 1 shows a block diagram of one embodiment of the digital signal processing method of the present invention.

The figures are not intended to be exhaustive or to limit the invention to the precise form disclosed. It should be understood that the invention can be practiced with modification and alteration, and that the invention be limited only by the claims and the equivalents thereof.

DETAILED DESCRIPTION OF THE PREFERRED EMBODIMENT

It is to be understood that the present invention is not limited to the particular methodology, compounds, materials, manufacturing techniques, uses, and applications described herein, as these may vary. It is also to be understood that the terminology used herein is used for the purpose of describing particular embodiments only, and is not intended to limit the scope of the present invention. It must be noted that as used herein and in the appended embodiments, the singular forms "a," "an," and "the" include the plural reference unless the context clearly dictates otherwise. Thus, for example, a reference to "an audio device" or separate device is a reference to one or more audio devices or separate devices that implement the systems and methods of the present invention, whether integrated or not and includes equivalents thereof known to those skilled in the art. Similarly, for another example, a reference to "a step" or "a means" is a reference to one or more steps or means and may include sub-steps and subservient means. All conjunctions used are to be understood in the most inclusive sense possible. Thus, the word "or" should be understood as having the definition of a logical "or" rather than that of a logical "exclusive or" unless the context clearly necessitates otherwise. Language that may be construed to express approximation should be so understood unless the context clearly dictates otherwise.

Unless defined otherwise, all technical and scientific terms used herein have the same meanings as commonly understood by one of ordinary skill in the art to which this invention belongs. Preferred methods, techniques, devices, and materials are described, although any methods, techniques, devices, or materials similar or equivalent to those described herein may be used in the practice or testing of the present invention. Structures described herein are to be understood also to refer to functional equivalents of such structures.

1.0 Overview

First, some background on linear time-invarient systems is helpful. A linear, time-invariant (LTI) discrete-time filter of order N with input x[k] and output y[k] is described by the following difference equation:

$$y[k] = b_0 x[k] + b_1 x[k-1] + \ldots + b_N x[k-N] + a_1 y[k-1] + a_2 y[k-2] + \ldots + a_N y[k-N]$$

where the coefficients $\{b0, b1, \ldots, bN, a1, a2, \ldots, aN\}$ are chosen so that the filter has the desired characteristics (where the term desired can refer to time-domain behavior or frequency domain behavior).

The difference equation above can be excited by an impulse function, $\delta[k]$, whose value is given by $$\delta[k] = \begin{cases} 1, & k = 0 \\ 0, & k \neq 0 \end{cases}$$

When the signal $\delta[k]$ is applied to the system described by the above difference equation, the result is known as the impulse response, h[k]. It is a well-known result from system theory that the impulse response h[k] alone completely characterizes the behavior of a LTI discrete-time system for any input signal. That is, if h[k] is known, the output y[k] for an input signal x[k] can be obtained by an operation known as convolution. Formally, given h[k] and x[k], the response y[k] can be computed as $$y[k] = \sum_{n=0}^{\infty} h[n]x[k-n]$$

Some background on the z-transform is also helpful. The relationship between the time-domain and the frequency-domain is given by a formula known as the z-transform. The z-transform of a system described by the impulse response h[k] can be defined as the function H(z) where $$H(z) = \sum_{k=0}^{\infty} h[k]z^{-k}$$

and z is a complex variable with both real and imaginary parts. If the complex variable is restricted to the unit circle in the complex plane (i.e., the region described by the relationship [z]=1), what results is a complex variable that can be described in radial form as $z=e^{j\theta}$, where $0 \leq \theta 2\pi$ and $j=\sqrt{-1}$ Some background on the discrete-time Fourier transform is also instructive. With z described in radial form, the restriction of the z-transform to the unit circle is known as the discrete-time Fourier transform (DTFT) and is given by $$H(e^{j\theta}) = \sum_{k=0}^{\infty} h[k]e^{-jk\theta}$$

Of particular interest is how the system behaves when it is excited by a sinusoid of a given frequency. One of the most significant results from the theory of LTI systems is that sinusoids are Eigen functions of such systems. This means that the steady-state response of an LTI system to a sinusoid $\sin(\theta 0 k)$ is also a sinusoid of the same frequency $\theta 0$, differing from the input only in amplitude and phase. In fact, the steady-state output, yss[k] of the LTI system when driven by and input $x[k]=\sin(\theta_0 k)$ is given by $y_{\delta\delta[k]=A} \sin(\theta_0 k+\phi_0)$ where $A=|H(e^{j\theta}_0)|$ and $\phi_0=\arg(H(e^{j\theta}_0))$ Finally, some background on frequency response is needed. The equations above are significant because they indicate that the steady-state response of an LTI system when driven by a sinusoid is a sinusoid of the same frequency, scaled by the magnitude of the DTFT at that frequency and offset in time by the phase of the DTFT at that frequency. For the purposes of the present invention, what is of concern is the amplitude of the steady state response, and that the DTFT provides us with the relative magnitude of output-to-input when the LTI system is driven by a sinusoid. Because it is well-known that any input signal may be expressed as a linear combination of sinusoids (the Fourier decomposition theorem), the DTFT can give the response for arbitrary input signals. Qualitatively, the DTFT shows how the system responds to a range of input frequencies, with the plot of the magnitude of the DTFT giving a meaningful measure of how much signal of a given frequency will appear at the system's output. For this reason, the DTFT is commonly known as the system's frequency response.

2.0 Digital Signal Processing

FIG. 1 illustrates an example digital signal process flow of a method 100 according to one embodiment of the present invention. Referring now to FIG. 1, method 100 includes the following steps: input gain adjustment 101, first low shelf filter 102, first high shelf filter 103, first compressor 104, second low shelf filter 105, second high shelf filter 106, graphic equalizer 107, second compressor 108, and output gain adjustment 109.

In one embodiment, digital signal processing method 100 may take as input audio signal 110, perform steps 101-109, and provide output audio signal 111 as output. In one embodiment, digital signal processing method 100 is executable on a computer chip, such as, without limitation, a digital signal processor, or DSP. In one embodiment, such a chip may be one part of a larger audio device, such as, without limitation, a radio, MP3 player, game station, cell phone, television, computer, or public address system. In one such embodiment, digital signal processing method 100 may be performed on the audio signal before it is outputted from the audio device. In one such embodiment, digital signal processing method 100 may be performed on the audio signal after it has passed through the source selector, but before it passes through the volume control.

In one embodiment, steps 101-109 may be completed in numerical order, though they may be completed in any other order. In one embodiment, steps 101-109 may exclusively be performed, though in other embodiments, other steps may be performed as well. In one embodiment, each of steps 101-109 may be performed, though in other embodiments, one or more of the steps may be skipped.

In one embodiment, input gain adjustment 101 provides a desired amount of gain in order to bring input audio signal 110 to a level that will prevent digital overflow at subsequent internal points in digital signal processing method 100.

In one embodiment, each of the low-shelf filters 102, 105 is a filter that has a nominal gain of 0 dB for all frequencies above a certain frequency termed the corner frequency. For frequencies below the corner frequency, the low-shelving filter has a gain of ±G dB, depending on whether the low-shelving filter is in boost or cut mode, respectively. This is shown in FIG. 2.

In one embodiment, the systems and methods described herein may be implemented in a separate device that is located (e.g., wired or wirelessly) between, for example, a vehicle head unit, radio or other audio source and the vehicle's or other audio source's speaker system. This device may be installed at the factory. In another embodiment, however, this device may be retrofitted into a preexisting vehicle or other audio system. The device might also be used in conjunction with other audio or video equipment and speaker systems in addition to vehicle audio systems. For example, the device might be used in conjunction with a home stereo system and home stereo speakers or a vehicle DVD video/audio system and it may be wired or wireless.

Figure 2:
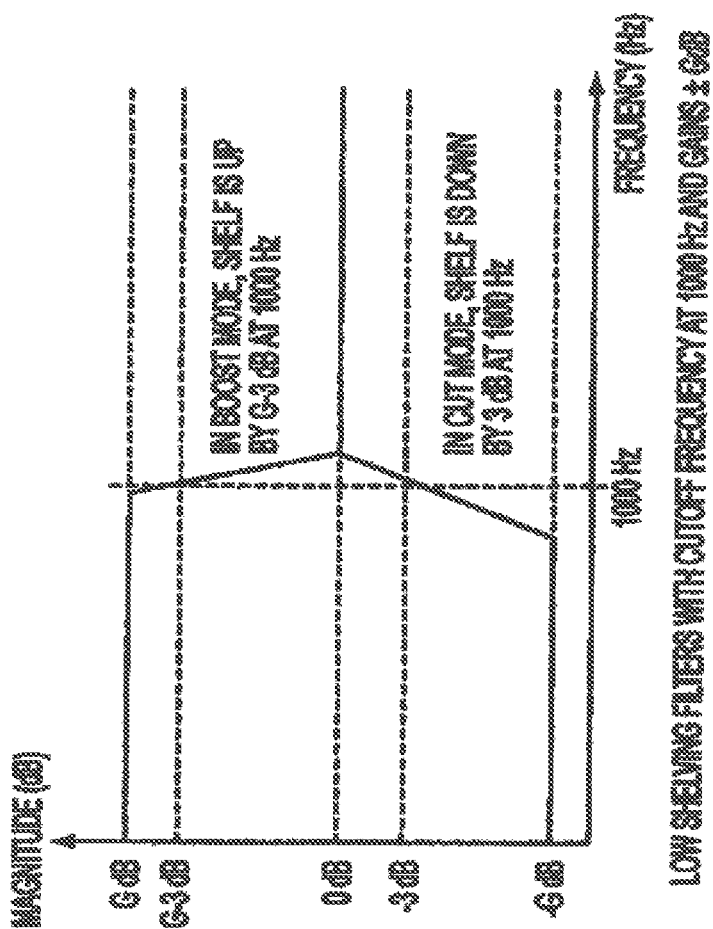
FIG. 2 shows the effect of a low-shelf filter used in one embodiment of the digital signal processing method of the present invention.

FIG. 2 illustrates the effect of a low-shelf filter being implemented by one embodiment of the present invention. Referring now to FIG. 2, the purpose of a low-shelving filter is to leave all of the frequencies above the corner frequency unaltered, while boosting or cutting all frequencies below the corner frequency by a fixed amount, G dB. Also, note that the 0 dB point is slightly higher than the desired 1000 Hz. It is standard to specify a low-shelving filter in cut mode to have a response that is at −3 dB at the corner frequency, whereas a low-shelving filter in boost mode is specified such that the response at the corner frequency is at G-3 dB—namely, 3 dB down from maximum boost. Indeed, all of the textbook formulae for creating shelving filters lead to such responses. This leads to a certain amount of asymmetry, where for almost all values of boost or cut G, the cut and boost low-shelving filters are not the mirror images of one another. This is something that needed to be address by the present invention, and required an innovative approach to the filters' implementations.

Figure 3:
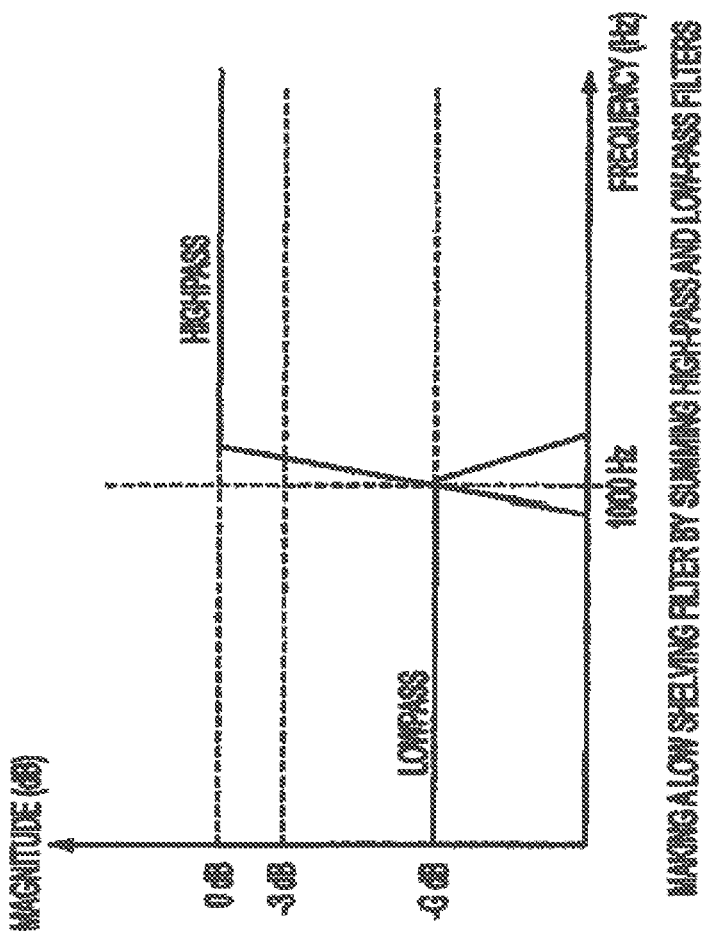
FIG. 3 shows how a low-shelf filter can be created using high-pass and low-pass filters.

Ignoring for now the asymmetry, the standard method for creating a low-shelving filter is as the weighted sum of high-pass and low-pass filters. For example, let's consider the case of a low-shelving filter in cut mode with a gain of −G dB and a corner frequency of 1000 Hz. FIG. 3 shows a high-pass filter with a 1000 cutoff frequency and a low-pass filter with a cutoff frequency of 1000 Hz, scaled by −G dB. The aggregate effect of these two filters applied in series looks like the low-shelving filter in FIG. 2. In practice, there are some limitations on the steepness of the transition from no boost or cut to G dB of boost or cut. FIG. 3 illustrates this limitation, with the corner frequency shown at 1000 Hz and the desired G dB of boost or cut not being achieved until a particular frequency below 1000 Hz. It should be noted that all of the shelving filters in the present invention are first-order shelving filters, which means they can usually be represented by a first-order rational transfer function:

$$H(z) = \frac{b_0 + b_1 z^{-1}}{1 + a_1 z^{-1}}$$

Figure 4:
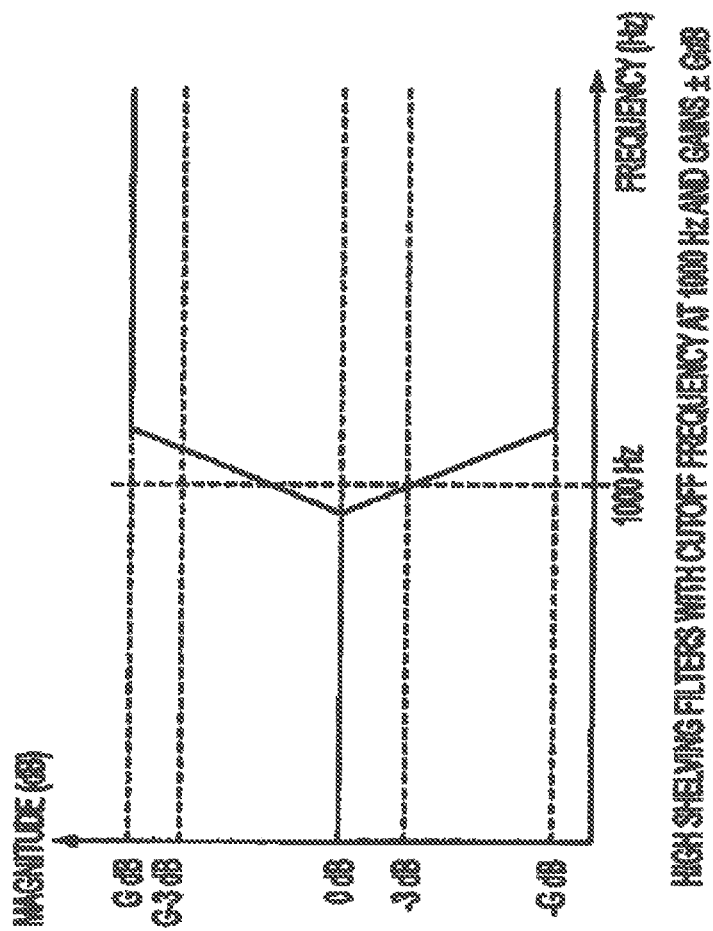
FIG. 4 shows the effect of a high-shelf filter used in one embodiment of the digital signal processing method of the present invention.

In some embodiments, each of the high-shelf filters 103, 106 is nothing more than the mirror image of a low-shelving filter. That is, all frequencies below the corner frequency are left unmodified, whereas the frequencies above the corner frequency are boosted or cut by G dB. The same caveats regarding steepness and asymmetry apply to the high-shelving filter. FIG. 4 illustrates the effect of a high-shelf filter implemented by an embodiment of the present invention. Referring now to FIG. 4, a 1000 Hz high-shelving filter is shown.

Figure 5:
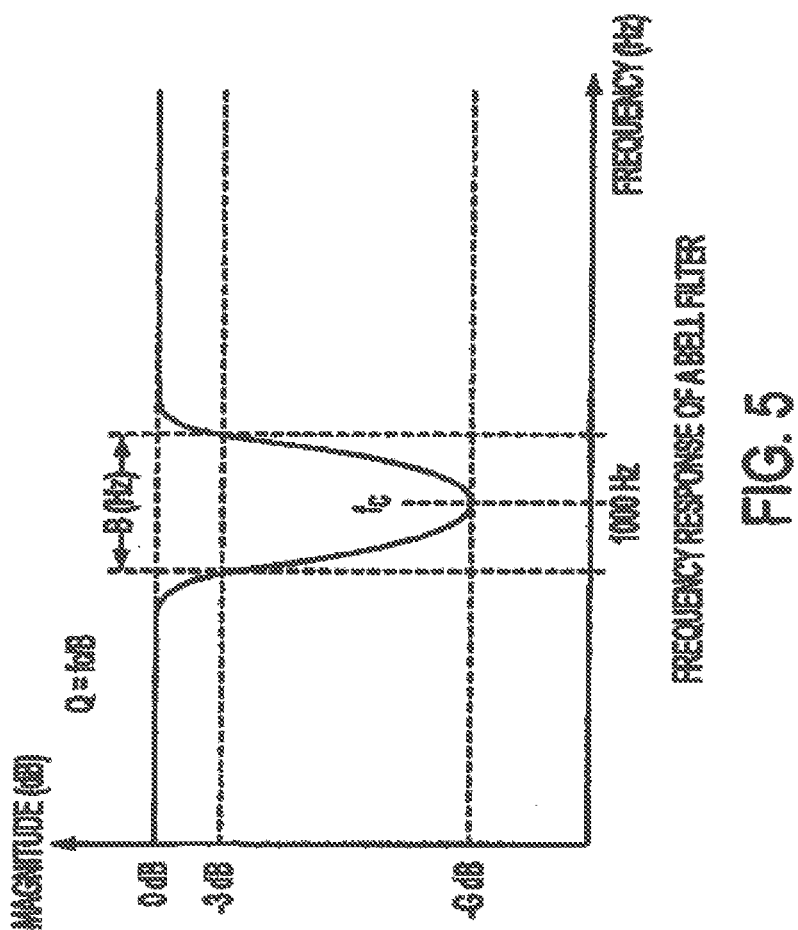
FIG. 5 shows the frequency response of a bell filter used in one embodiment of the digital signal processing method of the present invention.

FIG. 5 illustrates an example frequency response of a bell filter implemented by method 100 according to one embodiment of the present invention. As shown in FIG. 5, each of the second order filters achieves a bell-shaped boost or cut at a fixed center frequency, with F1(z) centered at 30 Hz, F11(z) centered at 16000 Hz, and the other filters in between centered at roughly one-octave intervals. Referring to FIG. 5, a bell-shaped filter is shown centered at 1000 Hz. The filter has a nominal gain of 0 dB for frequencies above and below the center frequency, 1000 Hz, a gain of −G dB at 1000 Hz, and a bell-shaped response in the region around 1000 Hz.

The shape of the filter is characterized by a single parameter: the quality factor, Q. The quality factor is defined as the ratio of the filter's center frequency to its 3-dB bandwidth, B, where the 3-dB bandwidth is illustrated as in the figure: the difference in Hz between the two frequencies at which the filter's response crosses the −3 dB point.

Figure 6:
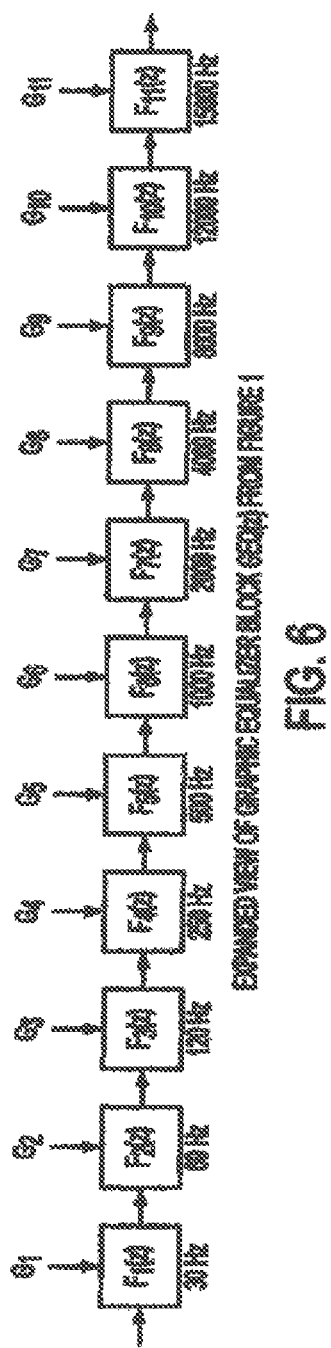
FIG. 6 shows a block diagram of one embodiment of a graphic equalizer used in one embodiment of the digital signal processing method of the present invention.

FIG. 6 illustrates an example graphic equalizer block 600 according to one embodiment of the present invention. Referring now to FIG. 6, graphic equalizer 600 consists of a cascaded bank of eleven second-order filters, $F_1(z), F_2(z), \ldots, F_{11}(z)$. In one embodiment, graphic equalizer 107 (as shown in FIG. 1) is implemented as graphic equalizer 600.

One embodiment may have eleven second-order filters which can be computed from formulas that resemble this one:

$$F(z) = \frac{b_0 + b_1 z^{-1} + b_2 z^{-2}}{1 + a_1 z^{-1} + a_2 z^{-2}}$$

Using such an equation results in one problem: each of the five coefficients above, $\{b_0, b_1, b_2, a_1, a_2\}$ depends directly on the quality factor, Q, and the gain, G. This means that for the filter to be tunable, that is, to have variable Q and G, all five coefficients must be recomputed in real-time. This can be problematic, as such calculations could easily consume the memory available to perform graphic equalizer 107 and create problems of excessive delay or fault, which is unacceptable. This problem can be avoided by utilizing the Mitra-Regalia Realization.

A very important result from the theory of digital signal processing (DSP) is used to implement the filters used in digital signal processing method 100. This result states that a wide variety of filters (particularly the ones used in digital signal processing method 100) can be decomposed as the weighted sum of an allpass filter and a feed forward branch from the input. The importance of this result will become clear. For the time being, suppose that a second-order transfer function, H(z), is being implemented to describes a bell filter centered at fc with quality factor Q and sampling frequency Fs by $$H(z) = \frac{b_0 + b_1 z^{-1} + b_2 z^{-2}}{1 + a_1 z^{-1} + a_2 z^{-2}}$$

Ancillary quantities k1, k2 can be defined by $$k_1 = \frac{1 - \tan\left(\frac{\pi f_c}{QF_s}\right)}{1 + \tan\left(\frac{\pi f_c}{QF_s}\right)}$$

$$k_2 = -\cos\left(\frac{2\pi f_c}{F_s}\right)$$

and transfer function, A(z) can be defined by $$A(z) = \frac{k_2 + k_1(1 + k_2)z^{-1} + z^{-2}}{1 + k_1(1 + k_2)z^{-1} + k_2 z^{-2}}$$

A(z) can be verified to be an allpass filter. This means that the amplitude of A(z) is constant for all frequencies, with only the phase changing as a function of frequency. A(z) can be used as a building block for each bell-shaped filter. The following very important result can be shown:

$$H(z) = \frac{1}{2}(1 + G)A(z) + \frac{1}{2}(1 - G)$$

Figure 7:
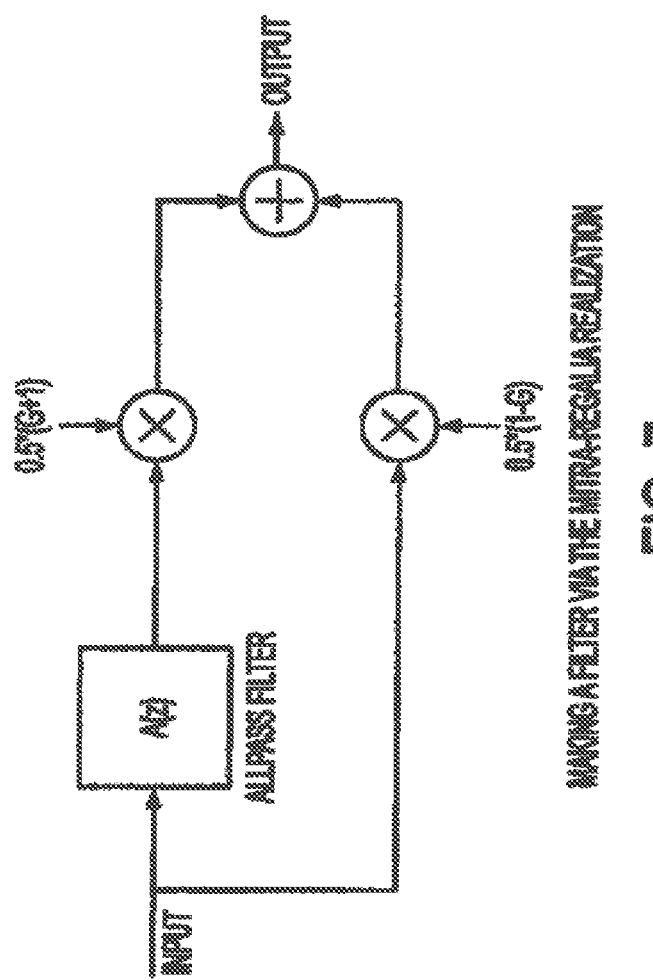
FIG. 7 shows a block diagram showing how a filter can be constructed using the Mitra-Regalia realization.

This is the crux of the Mitra-Regalia realization. A bell filter with tunable gain can be implemented to show the inclusion of the gain G in a very explicit way. This is illustrated in FIG. 7, which illustrates an example filter constructed using the Mitra-Regalia realization according to one embodiment of the present invention.

There is a very good reason for decomposing the filter in such a non-intuitive manner. Referring to the above equation, every one of the a and b coefficients needs to be re-computed whenever G gets changed (i.e., whenever one of the graphic EQ "slider" is moved). Although the calculations that need to be performed for the a and b coefficients have not been shown, they are very complex and time-consuming and it simply is not practical to recompute them in real time. However, in a typical graphic EQ, the gain G and quality factor Q remain constant and only G is allowed to vary. A(z) does not depend in any way on the gain, G and that if Q and the center-frequency fc remain fixed (as they do in a graphic EQ filter), then k1 and k2 remain fixed regardless of G. Thus, these variables only need to be computed once. Computing the gain variable is accomplished by varying a couple of simple quantities in real time:

$$\frac{1}{2}(1 + G)$$

and $$\frac{1}{2}(1 - G)$$

These are very simple computations and only require a couple of CPU cycles. This leaves only the question of how to implement the allpass transfer function, A(z). The entire graphic equalizer bank thus consists of 11 cascaded bell filters, each of which is implemented via its own Mitra-Regalia realization:

$$F_1(z) \to \text{fixed } k_1^1, k_2^1, \text{ variable } G_1$$

$$F_2(z) \to \text{fixed } k_1^2, k_2^2, \text{ variable } G_2$$

$$\vdots \qquad \vdots$$

$$F_{11}(z) \to \text{fixed } k_1^{11}, k_2^{11}, \text{ variable } G_{11}$$

Figure 8:
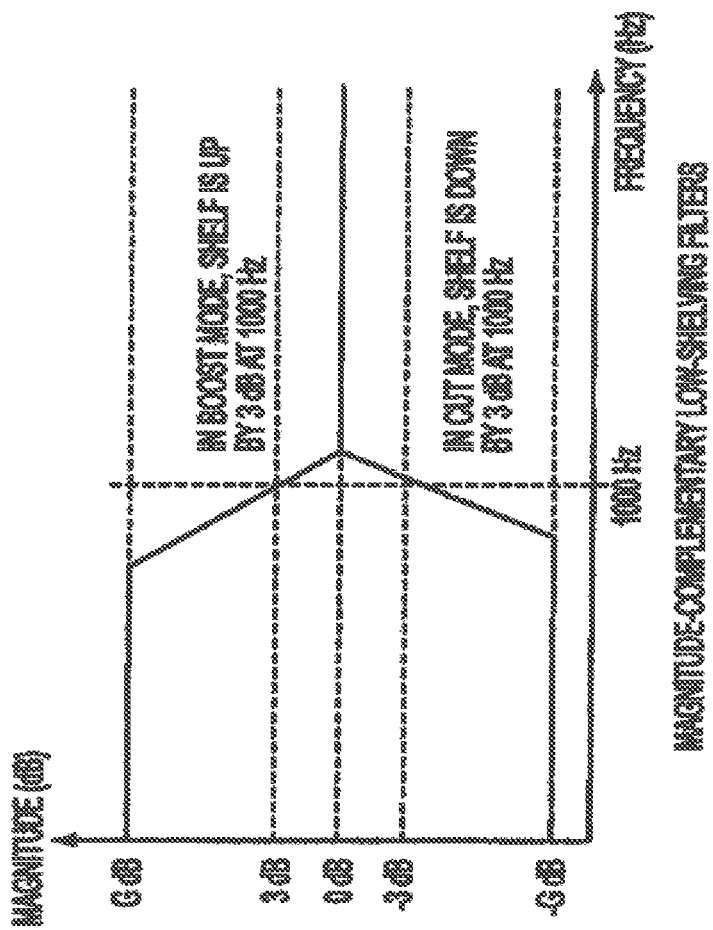
FIG. 8 shows the effect of magnitude-complementary low-shelf filters that may be used in one embodiment of the digital signal processing method of the present invention.

It can be seen from that equation that the entire graphic equalizer bank depends on a total of 22 fixed coefficients that need to be calculated only once and stored in memory. The "tuning" of the graphic equalizer is accomplished by adjusting the parameters G1, G2, ..., G11. See FIG. 6 to see this in schematic form. The Mitra-Regalia realization may be used over and over in the implementation of the various filters used in digital signal processing method 100. Mitra-Regalia may also be useful in implementing the shelving filters, where it is even simpler because the shelving filters use first-order filter. The net result is that a shelving filter is characterized by a single allpass parameter, k, and a gain, G. As with the bell filters, the shelving filters are at fixed corner frequencies (in fact, all of them have 1 kHz as their corner frequency) and the bandwidth is also fixed. All told, four shelving filters are completely described simply by $H_1(z) \to$ fixed $k^1$, variable $G_1$
$H_2(Z) \to$ fixed $k^2$, variable $G_2$
$H_3(Z) \to$ fixed $k^3$, variable $G_3$
$H_4(z) \to$ fixed $k^4$, variable $G_4$ As discussed above, there is an asymmetry in the response of a conventional shelving filter when the filter is boosting versus when it is cutting. This is due, as discussed, to the design technique having different definitions for the 3-dB point when boosting than when cutting. Digital signal processing method 100 relies on the filters H1(z) and H3(z) being the mirror images of one another and the same holds for H2(z) and H4(z). This led to the use of a special filter structure for the boosting shelving filters, one that leads to perfect magnitude cancellation for H1,H3 and H2,H4, as shown in FIG. 8. This type of frequency response is known as magnitude complementary. This structure is unique to the present invention. In general, it is a simple mathematical exercise to derive for any filter H(z) a filter with complementary magnitude response. The filter H-1(z) works, but may not be stable or implementable function of z, in which case the solution is merely a mathematical curiosity and is useless in practice. This is the case with a conventional shelving filter. The equations above show how to make a bell filter from an allpass filter. These equation applies equally well to constructing a shelving filter beginning with a first-order allpass filter, A(z), where $$A(z) = \frac{\alpha - z^{-1}}{1 - \alpha z^{-1}}$$

and α is chosen such that $$\alpha = \frac{\left(1 - \sin\left(\frac{2\pi f_c}{F_s}\right)\right)}{\cos\left(\frac{2\pi f_c}{F_s}\right)}$$

where fc is the desired corner frequency and Fs is the sampling frequency. Applying the above equations and re-arranging terms, this can be expressed as $$H(z) = \frac{1+G}{2}\left\{1 + \frac{1-G}{1+G}A(z)\right\}$$

This is the equation for a low-shelving filter. (A high-shelving filter can be obtained by changing the term (1−G) to (G−1)). Taking the inverse of H(z) results in the following:

$$\frac{1}{H(z)} = \frac{2}{(1+G)\left(1 + \frac{1-G}{1+G}A(z)\right)}$$

This equation is problematic because it contains a delay-free loop, which means that it cannot be implemented via conventional state-variable methods. Fortunately, there are some recent results from system theory that show how to implement rational functions with delay-free loops. Fontana and Karjalainen (IEEE Signal Processing Letters, Vol. 10, No. 4, April 2003) show that each step can be "split" in time into two "sub-steps."

Figure 9:
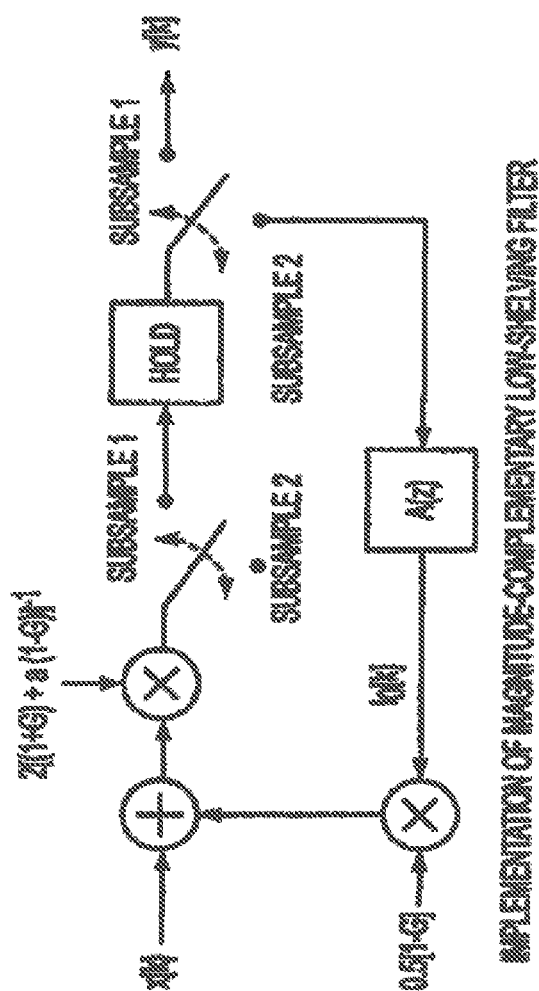
FIG. 9 shows a block diagram of an implementation of a magnitude-complementary low-shelf filter that may be used in one embodiment of the digital signal processing method of the present invention.

FIG. 9 illustrates an example magnitude-complementary low-shelf filter according to one embodiment of the present invention. During the first sub-step (labeled "subsample 1"), feed filter A(z) with zero input and compute its output, 10[k]. During this same subsample, calculate the output y[k] using the value of 10[k], which from the equation immediately above can be performed as follows:

$$y[k] = \frac{1}{1+\alpha\frac{1-G}{1+G}}\left\{\frac{2}{1+G}x[k] + \left(\frac{1-G}{1+G}l_0[k]\right)\right\}$$

$$= \frac{2}{(1+G)+\alpha(1-G)}\left\{x[k] + \frac{1-G}{2}l_0[k]\right\}$$

It can be seen from FIG. 9 that these two calculations correspond to the case where the switches are in the "subsample 1" position. Next, the switches are thrown to the "subsample 2" position and the only thing left to do is update the internal state of the filter A(z). This unconventional filter structure results in perfect magnitude complementarity, 11. This can be exploited for the present invention in the following manner: when the shelving filters of digital signal processing method 100 are in "cut" mode, the following equation can be used:

$$H(z) = \frac{1+G}{2}\left\{1 + \frac{1-G}{1+G}A(z)\right\}$$

However, when the shelving filters of digital signal processing method 100 are in "boost" mode, the following equation can be used with the same value of G as used in "cut" mode:

$$y[k] = \frac{1}{1+\alpha\frac{1-G}{1+G}}\left\{\frac{2}{1+G}x[k] + \frac{1-G}{1+G}l_0[k]\right\}$$

$$= \frac{2}{(1+G)+\alpha(1-G)}\left\{x[k] + \frac{1-G}{2}l_0[k]\right\}$$

This results in shelving filters that are perfect mirror images of one another, as illustrated in FIG. 8, which is what is needed for digital signal processing method 100. (Note: Equation 16 can be changed to make a high-shelving filter by changing the sign on the (1−G)/2 term). FIG. 8 illustrates the effect of a magnitude-complementary low-shelf filter implemented by an embodiment of the present invention.

Figure 10:
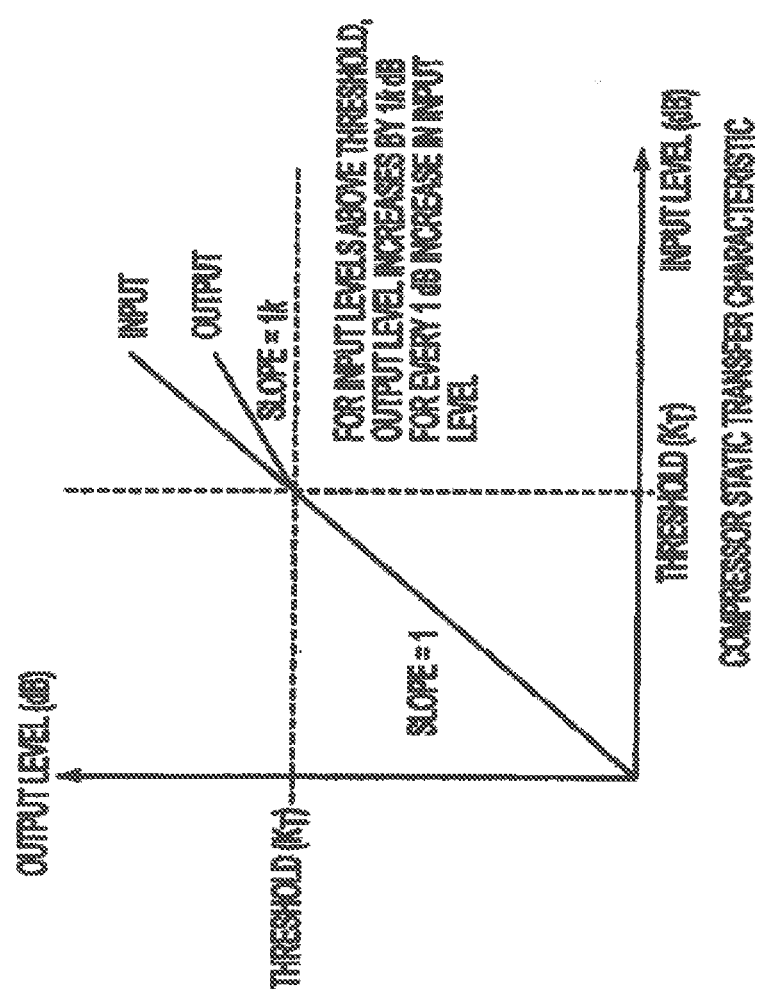
FIG. 10 shows the static transfer characteristic (the relationship between output and input levels) of a compressor used in one embodiment of the digital signal processing method of the present invention.

Each of the compressors 104, 108 is a dynamic range compressor designed to alter the dynamic range of a signal by reducing the ratio between the signal's peak level and its average level. A compressor is characterized by four quantities: the attack time, Tatt, the release time, Trel, the threshold, KT, and the ratio, r. In brief, the envelope of the signal is tracked by an algorithm that gives a rough "outline" of the signal's level. Once that level surpasses the threshold, KT, for a period of time equal to Tatt, the compressor decreases the level of the signal by the ratio r dB for every dB above KT. Once the envelope of the signal falls below KT for a period equal to the release time, Trel, the compressor stops decreasing the level. FIG. 10 illustrates a static transfer characteristic (relationship between output and input levels) of a compressor implemented in accordance with one embodiment of the present invention.

It is instructive to examine closely the static transfer characteristic. Assume that the signal's level, L[k] at instant k has been somehow computed. For instructive purposes, a one single static level, L, will be considered. If L is below the compressor's trigger threshold, KT, the compressor does nothing and allows the signal through unchanged. If, however, L is greater than KT, the compressor attenuates the input signal by r dB for every dB by which the level L exceeds KT.

It is instructive to consider an instance where L is greater than KT, which means that $20 \log_{10}(L) > 20 \log_{10}(KT)$. In such an instance, the excess gain, i.e., the amount in dB by which the level exceeds the threshold, is: $g_{excess} = 20 \log_{10}(L) - 20 \log_{10}(KT)$. As the compressor attenuates the input by r dB for every dB of excess gain, the gain reduction, gR, can be expressed as $$gR = \frac{g_{excess}}{R} = \frac{1}{R} \cdot (20 \log_{10}(L) - 20 \log_{10}(KT))$$

From that, it follows that that with the output of the compressor, y given by $20 \log_{10}(y) = gR \cdot 20 \log_{10}(x)$, that the desired output-to-input relationship is satisfied.

Conversion of this equation to the linear, as opposed to the logarithmic, domain yields the following:

$$y = (10^{\log_{10}(x)}) \frac{1}{R} (\log_{10}(L) - \log_{10}(KT))$$

The most important part of the compressor algorithm is determining a meaningful estimate of the signal's level. This is accomplished in a fairly straightforward way: a running "integration" of the signal's absolute value is kept, where the rate at which the level is integrated is determined by the desired attack time. When the instantaneous level of the signal drops below the present integrated level, the integrated level is allowed to drop at a rate determined by the release time. Given attack and release times Tatt and Trel, the equation used to keep track of the level, L[k] is given by $$L[k] = \begin{cases} (1-\alpha_{att})|x[k]| + \alpha_{att}L[k-1] & \text{for } |x[k]| \geq L[k-1] \\ (1-\alpha_{rel})|x[k]| + \alpha_{rel}L[k-1] & \text{for } |x[k]| < L[k-1] \end{cases}$$

where $$\alpha_{att} = \exp\left(\frac{1}{F_g T_{att}}\right)$$

and $$\alpha_{rel} = \exp\left(\frac{1}{5 F_g T_{rel}}\right)$$

At every point of the level calculation as described above, L[k] as computed is compared to the threshold KT, and if L[k] is greater than KT, the input signal, x[k], is scaled by an amount that is proportional to the amount by which the level exceeds the threshold. The constant of proportionality is equal to the compressor ratio, r. After a great deal of mathematical manipulation, the following relationship between the input and the output of the compressor is established:

With the level L[k] as computed using, for example, the equation for L[k], above, the quantity Gexcess by is computed as $$G_{excess} = L[k] K_T^{-1}$$

which represents the amount of excess gain. If the excess gain is less than one, the input signal is not changed and passed through to the output. In the event that the excess gain exceeds one, the gain reduction, GR is computed by:

$$G_R = (G_{excess})^{\frac{1-r}{r}} = (L[k] K_T^{-1})^{\frac{1-r}{r}}$$

and then the input signal is scaled by GR and sent to the output:

$$\text{output}[k] = G_R x[k]$$

Through this procedure, an output signal whose level increases by 1/r dB for every 1 dB increase in the input signal's level is created.

In practice, computing the inverse $K_T^{-1}$ for the above equations can be time consuming, as certain computer chips are very bad at division in real-time. As KT is known in advance and it only changes when the user changes it, a pre-computed table of $K_T^{-1}$ values can be stored in memory and used as needed. Similarly, the exponentiation operation in the above equation calculating GR is extremely difficult to perform in real time, so pre-computed values can be used as an approximation. Since quantity GR is only of concern when Gexcess is greater than unity, a list of, say, 100 values of GR, pre-computed at integer values of GR from GR=1 to GR=100 can be created for every possible value of ratio r. For non-integer values of GR (almost all of them), the quantity in the above equation calculating GR can be approximated in the following way. Let interp be the amount by which Gexcess exceeds the nearest integral value of Gexcess. In other words, $$\text{interp} = G_{excess} - \lfloor (G_{excess}) \rfloor$$

and let GR,0 and GR,1 refer to the pre-computed values $$G_{R,0} = \lfloor (G_{excess}) \rfloor^{\frac{1-r}{r}}$$

and $$G_{R,1} = \lfloor (1 + G_{excess}) \rfloor^{\frac{1-r}{r}}$$

Linear interpolation may then be used to compute an approximation of GR as follows:

$$G_R = G_{R,0} \text{interp} * (G_{R,1} - G_{R,0})$$

The error between the true value of GR and the approximation in the above equation can be shown to be insignificant for the purposes of the present invention. Furthermore, the computation of the approximate value of GR requires only a few arithmetic cycles and several reads from pre-computed tables. In one embodiment, tables for six different values of ratio, r, and for 100 integral points of Gexcess may be stored in memory. In such an embodiment, the entire memory usage is only 600 words of memory, which can be much more palatable than the many hundred cycles of computation that would be necessary to calculate the true value of GR directly. This is a major advantage of the present invention.

Each of the digital filters in digital signal processing method 100 may be implemented using any one of a variety of potential architectures or realizations, each of which has its trade-offs in terms of complexity, speed of throughput, coefficient sensitivity, stability, fixed-point behavior, and other numerical considerations. In a specific embodiment, a simple architecture known as a direct-form architecture of type 1 (DF1) may be used. The DF1 architecture has a number of desirable properties, not the least of which is its clear correspondence to the difference equation and the transfer function of the filter in question. All of the digital filters in digital signal processing method 100 are of either first or second order.

The second-order filter will be examined in detail first. As discussed above, the transfer function implemented in the second-order filter is given by $$H(z) = \frac{b_0 + b_1 z^{-1} + b_2 z^{-2}}{1 + a_1 z^{-1} + a_2 z^{-2}}$$

which corresponds to the difference equation $$y[k] = b_0 x[k] + b_1 x[k-1] + b_2 x[k-2] - a_1 y[k-1] - a_2 y[k-2]$$

Figure 11:
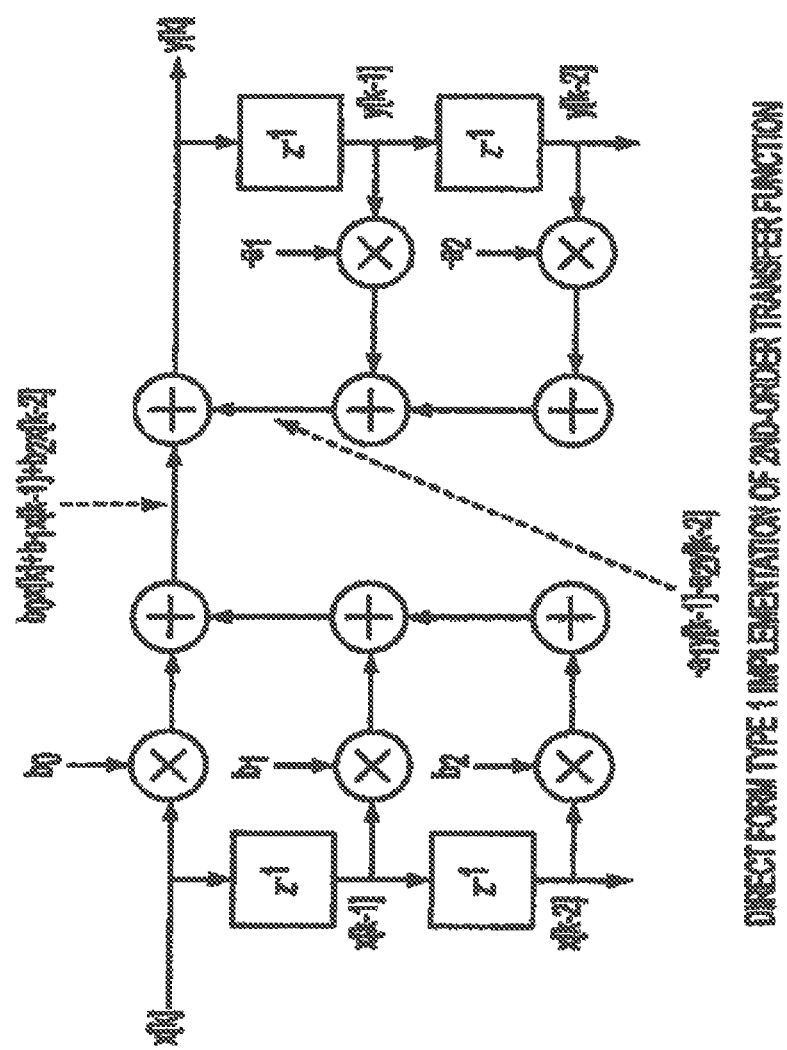
FIG. 11 shows a block diagram of a direct form type 1 implementation of second order transfer function used in one embodiment of the digital signal processing method of the present invention.

FIG. 11 illustrates the DF1 architecture for a second-order filter according to one embodiment of the present invention. As shown in FIG. 11, the multiplier coefficients in this filter structure correspond to the coefficients in the transfer function and in the difference equation above. The blocks marked with the symbol z-1 are delay registers, the outputs of which are required at every step of the computation. The outputs of these registers are termed state variables and memory is allocated for them in some embodiments of digital signal processing method 100. The output of the digital filter is computed as follows:

Initially, each of the state variables is set to zero. In other words, $$x[-1] = x[-2] = y[-1] = y[-2] = 0.$$

At time k=0 the following computation is done, according to FIG. 11:

$$y[0] = b_0 x[0] + b_1 x[-1] + b_2 x[-2] - a_1 y[-1] - a_2 y[-2].$$

Then, the registers are updated so that the register marked by x[k-1] now holds x[0], the register marked by x[k-2] now holds x[-1], the register marked by y[k-1] holds y[0], and the register marked by y[k-2] holds y[-1].

At time k=1 the following computation is done:

$$y[1] = b_0 x[1] + b_1 x[0] + b_2 x[-1] - a_1 y[0] - a_2 y[-1].$$

Then, the register update is again completed so that the register marked by x[k-1] now holds x[1], the register marked by x[k-2] now holds x[0], the register marked by y[k-1] holds y[1], and the register marked by y[k-2] holds y[0].

This process is then repeated over and over for all instants k: A new input, x[k], is brought in, a new output y[k] is computed, and the state variables are updated.

In general, then, the digital filtering operation can be viewed as a set of multiplications and additions performed on a data stream x[0], x[1], x[2], ... using the coefficients b0, b1, b2, a1, a2 and the state variables x[k-1], x[k-2], y[k-1], y[k-2].

The manifestation of this in specific situations is instructive. Examination of the bell filter that constitutes the fundamental building-block of graphic equalizer 107 is helpful. As discussed above, the bell filter is implemented with a sampling frequency Fs, gain G at a center frequency fc, and quality factor Q as $$H(z) = \frac{1}{2}(1 + G)A(z) + \frac{1}{2}(1 - G)$$

where A(z) is an allpass filter defined by $$A(z) = \frac{k_2 + k_1(1 + k_2)z^{-1} + z^{-2}}{1 + k_1(1 + k_2)z^{-1} + k_2 z^{-2}}$$

where k1 and k2 are computed from fc and Q via the equations $$k_1 = \frac{1 - \tan\left(\frac{\pi f_c}{Q F_s}\right)}{1 + \tan\left(\frac{\pi f_c}{Q F_s}\right)}$$

and $$k_2 = -\cos\left(\frac{2\pi f_c}{F_s}\right)$$

The values k1 and k2 are pre-computed and stored in a table in memory. To implement a filter for specific values of Q and fc, the corresponding values of k1 and k2 are looked up in this table. Since there are eleven specific values of fc and sixteen specific values of Q in the algorithm, and the filter operates at a single sampling frequency, Fs, and only k2 depends on both fc and Q, the overall storage requirements for the k1 and k2 coefficient set is quite small (11.times.16.times.2 words at worst).

Observe from the equation above for A(z) that its coefficients are symmetric. That is, the equations can be re-written as $$A(z) = \frac{z^{-2} + \text{geq\_b1} z^{-1} + \text{geq\_b0}}{1 + \text{geq\_b1} z^{-1} + \text{geq\_b0} z^{-2}}$$

where $$\text{geq}_{b0} = k_2$$

and $$\text{geq}_{b1} = k_1(1 + k_2)$$

Observe that A(z) as given in the above equation implies the difference equation $$y[k]=geq_{b0}(x[k]+geq_{b1}x[k-1]+x[k-2]-geq_{b1}y[k-1]-geq_{b0}y[k-2]$$

which can be rearranged to yield $$y[k]=geq_{b0}(x[k]-y[k-2])+geq_{b1}(x[k-1]-y[k-1])+x[k-2]$$

In a specific embodiment, the state variables may be stored in arrays xv[ ] and yv[ ] with xv[0] corresponding to x[k−2], xv[1] corresponding to x[k−1], yv[0] corresponding to y[k−2] and yv[1] corresponding to y[k−1]. Then the following code-snippet implements a single step of the allpass filter:

```
void allpass(float *xv, float *yv, float *input, float *output)
{
    *output = geq_b0 * (*input − yv[0]) + geq_b1 *
        (xv[1] − yv[1]) + xv[0]
    xv[0] = xv[1]; \\ update
    xv[1] = *input; \\ update
    yv[0] = yv[1]; \\update
    yv[1] = *output; \\update
}
```

Now the loop may be incorporated around the allpass filter as per the equations above. This is trivially realized by the following:

```
void bell(float *xv, float *yv, float gain, float *input, float
*output)
{
    allpass(xv, yv, input, output);
    *output = 0.5 * (1.0−gain) * (*output) + 0.5 * (1.0+gain) *
    (*input);
}
```

More concisely, the previous two code snippets can be combined into a single routine that looks like this:

```
void bell(float *xv, float *yv, float gain, float *input, float
*output)
{
    float ap_output = geq_b0 * (*input − yv[0]) +
        geq_b1 * (xv[1] − yv[1]) + xv[0]
    xv[0] = xv[1]; \\ update
    xv[1] = *input; \\ update
    yv[0] = yv[1]; \\update
    yv[1] = *output; \\update
    *output = 0.5 * (1.0−gain) * ap_output + 0.5 * (1.0+gain) *
    (*input);
}
```

The first-order filter will now be examined in detail. These filters can be described by the transfer function $$H(z) = \frac{b_0 + b_1 z^{-1}}{1 + a_1 z^{-1}}$$

which corresponds to the difference equation $$y[k]=b_0 x[k]+b_1 x[k-1]-a_1 y[k-1].$$

Figure 12:
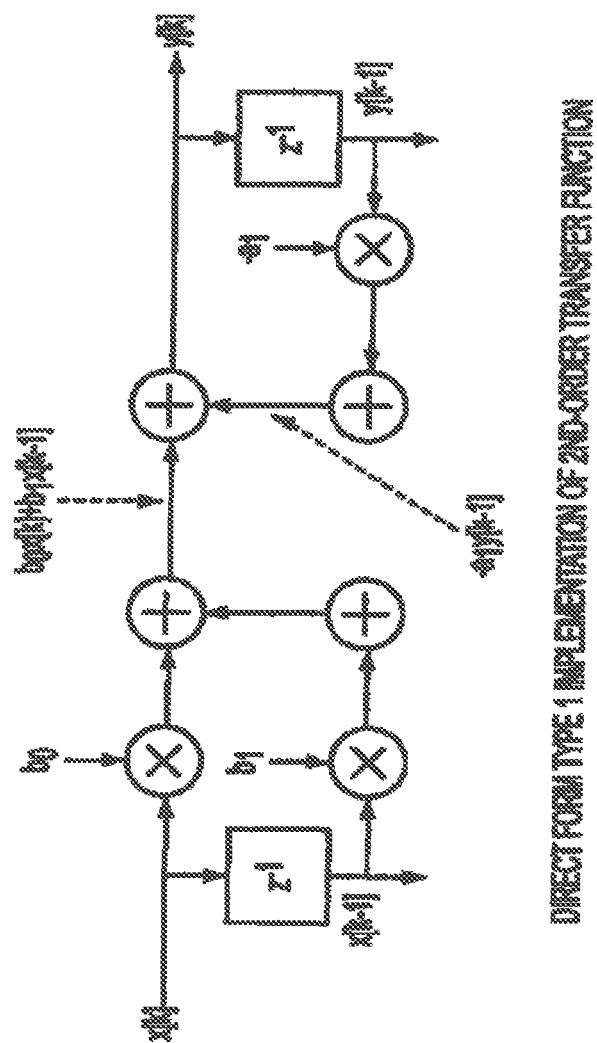
FIG. 12 shows a block diagram of a direct form type 1 implementation of second order transfer function used in one embodiment of the digital signal processing method of the present invention.

FIG. 12 illustrates the DF1 architecture for a first-order filter according to one embodiment of the present invention. Referring now to FIG. 12, the multiplier coefficients in this filter structure correspond in a clear way to the coefficients in the transfer function and in the difference equation. The output of the digital filter is computed as follows:

Initially, every one of the state variables is set to zero. In other words, $$x[-1]=y[-1]=0.$$

At time k=0 the following computation is done, according to FIG. 11:

$$y[0]=b_0 x[0]+b_1 x[-1]-a_1 y[-1].$$

Then, the registers are updated so that the register marked by x[k−1] now holds x[0], and the register marked by y[k−1] holds y[0].

At time k=1 the following computation is done:

$$y[1]=b_0 x[1]+b_1 x[0]-a_1 y[0].$$

Then, the register update is again completed so that the register marked by x[k−1] now holds x[1] and the register marked by y[k−1] holds y[1].

This process is then repeated over and over for all instants k: A new input, x[k], is brought in, a new output y[k] is computed, and the state variables are updated.

In general, then, the digital filtering operation can be viewed as a set of multiplications and additions performed on a data stream x[0], x[1], x[2], . . . using the coefficients b0, b1, a1 and the state variables x[k−1], y[k−1].

Furthermore, the digital signal processing system of at least one embodiment may process wireless input signals that are input into a wireless receiver. The wireless signals may be amplitude modulation signals, frequency modulation signals, digitally modulated signals, or other types of transmitted signals. The wireless receiver may be configured to receive the type of wireless input signal used, e.g., digitally modulated signals, etc.

In various embodiments, the wireless receiver may receive the wireless input signal and condition it prior to processing by a digital processing device such as the digital signal processor (DSP). For example, in some embodiments, high-level amplified signals may be conditioned to reduce the signal's range so that they are not outside the dynamic range of the analog-to-digital converters. The conditioned signal may then be input into a DSP.

The DSP may include necessary components for processing the input signals as described herein. For example, the DSP may run various digital processing algorithms, including, for example, noise cancellation algorithms other algorithms described herein. These algorithms may process audio signals to produce studio-quality sound.

The DSP may be coupled to an amplifier that amplifies the processed audio signal and provides an output signal for the headphone drivers. In some embodiments, the amplifier may include a multi-channel amplification section, such as a stereo amplifier. In some examples, multiple stereo amplifiers may be used.

In the amplifier, the level of the output signal may be raised so that it may be reproduced using the headphone driver to drive audio transducers, e.g., a pair of headphones. The audio transducer may be used to provide sound to a listener.

Headphones may include earphones, earbuds, stereophones, and headsets. The headphones generally comprise a pair of small loudspeakers, or, in some embodiments, a single speaker. The small loudspeaker or loudspeakers may be formed such that a user can hold them close to or within a user's ears. The headphones can include a connection device, such as a connector to connect the headphones to, e.g., an audio signal source such as the headphone driver. In some cases, the headphones used may be wireless headphones. In such an embodiment, a separate transmitter (not shown) can be connected to headphone drivers. This transmitter can then transmit a signal to the wireless headphone. This can allow a person wearing the headphones to move about more freely without having to be concerned for wires, which may get in the way or limit movement. Additionally, some embodiments may include noise cancellation headphones.

In other embodiments, a connector, e.g., a headphone connector might be used in conjunction with other circuitry to drive other types of audio transducers, such as speakers including full range drivers, subwoofers, woofers, mid-range drivers, and tweeters. These speakers might be horn loudspeakers, piezoelectric speakers, electrostatic loudspeakers, ribbon and planar magnetic loudspeakers, bending wave loudspeakers, flat panel loudspeakers, distributed mode loudspeakers, heil air motion transducers, or plasma arc speakers, to name a few. The speakers may be included in speaker enclosures, headphones, etc.

In certain embodiments, a power supply may provide power to the circuit DSP, amplifier, as well as other circuit elements, such as the system clocks, mater control unit, and the wireless receiver. In some embodiments, the power supply includes a battery that may store and provide power. The power from this battery, or other power source, such as a home alternating current power source, can be conditioned in the power supply. In embodiments that use a battery to provide power, the power supply may also include various circuitry to charge the battery.

The systems clocks generate and provide timing signals, e.g., clock signals to control the timing in the device. A crystal or other oscillator may be used to generate the system clocks. In some examples, a master clock may be divided to generate the needed clock signals.

The systems and methods described herein may include a power supply circuit. The power supply circuitry takes supplied voltage, converts and conditions it and provides power for various circuits used to process the audio signals.

A master control unit (MCU) can be used to control the overall functionality of the device. For example, in some embodiments, the MCU may boot, run, and control other circuits in the device.

In some embodiments, the systems and methods described herein may be used in a device external to a personal listening device, such as a set of headphones. In this way, the external device may drive the headphones and allow a listener to listen to, e.g., music. In other embodiments, the systems and methods described herein may be incorporated into a set of headphones. These systems and methods may be incorporated into, e.g., a set of headphones via a DSP in the headphone circuitry. This may allow a manufacturer or user in the context where the systems and methods are used in vehicles (e.g., Ford, GM, Toyota, Hyundai, etc.) the ability to create a custom profile or 'sound' for their specific vehicles and/or brands or types of vehicles (cars, trucks, SUVs, buses, RV's, military vehicles, such as tanks) and/or product lines. For example, in some cases a user might own multiple vehicles and might want each vehicle to provide a similar sound experience when using headphones in each of the vehicles. Alternatively, a user might want the sound experience while using the headphones to be the same or similar to a sound experience in a particular car when headphones are not used, e.g., when a head unit and speakers are used with the systems and methods described herein to produce, for example, studio quality sound. Accordingly, in some embodiments, the systems and methods described herein might be used to create the same or similar sound experience across multiple vehicles, using either headphones or speakers.

In some examples, the manufacturer or user can create profiles to suit the tastes of their customer and the vehicles they use or purchase. In other embodiments, the users of the headphones or other personal listening device may create their own profile by, for example, using a pair of headphones incorporating these systems and methods to listen to music and adjusting the system based on, for example, personal preferences. For example, when a user listens to music using the headphones or other personal listening device, they might adjust the processing of the music by adjusting a first low shelf filter, a first compressor, or a graphic equalizer. They might also change the processing of the music signal by adjusting a second compressor and adjust the gain of the compressed signal after the second compressor. In some examples, the user may adjust an amplifier that increases the amplitude of the signal into an input of headphone drivers.

Various embodiments of these systems and methods may be used in conjunction with vehicles in addition to cars, such as pickup trucks, SUV's, trucks, tractors, buses, etc. In some examples, these systems and methods may also be used in conjunction with aviation and marine applications. In various embodiments, these systems and methods may also be used in other areas were, e.g., headphones might be used to listen to music, for example, homes, offices, trailers, etc.

Figure 13:
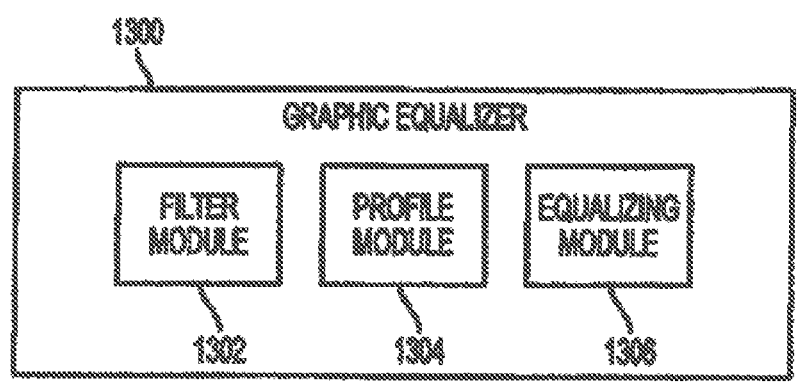
FIG. 13 is a block diagram of a graphic equalizer used in one embodiment of the digital signal processing method of the present invention.

FIG. 13 illustrates a graphic equalizer 1300 of at least one embodiment used in connection with digital signal processing. In various embodiments, the graphic equalizer 1300 comprises a filter module 1302, a profile module 1304, and an equalizing module 1306. The graphic equalizer 1300 may comprise the 11-band graphic equalizer 107. Those skilled in the art will appreciate that the graphic equalizer 1300 may comprise any number of bands.

The filter module 1302 comprises any number of filters. In various embodiments, the filters of the plurality of the filters in the filter module 1302 are in parallel with each other. One or more of the filters of the plurality of filters may be configured to filter a signal at a different frequency. In some embodiments, the filters of the plurality of filters are second order bell filters.

The profile module 1304 is configured to receive a profile. A profile comprises a plurality of filter equalizing coefficients (e.g., filter equalizing coefficient modifiers) which may be used to configure the filters of the graphic equalizer (e.g., the filters of the plurality of filters in the filter module 1302). In some embodiments, a profile may be directed to a particular type or model of hardware (e.g., speaker), particular listening environment (e.g., noisy or quiet), and/or audio content (e.g., voice, music, or movie). In some examples of hardware profiles, there may be a profile directed to cellular telephones, wired telephones, cordless telephones, communication devices (e.g., walkie talkies and other two-way radio transceivers), police radios, music players (e.g., Apple IPod and Microsoft Zune), headsets, earpieces, microphones, and/or the like.

For example, when a profile is directed to a particular type or model of hardware, the plurality of filter equalizing coefficients of that profile may configure the graphic equalizer 1300 to equalize one or more signals as to improve quality for that particular type or model of hardware. In one example, a user may select a profile directed at a particular model of PC speakers. The plurality of filter equalizing coefficients of the selected profile may be used to configure the graphic equalizer 1300 to equalize signals that are to be played through the PC speaker such that the perceived quality of the sound through the PC speaker attains a quality that may be higher than if the graphic equalizer 1300 was not so configured.

In another example, the user may select a profile directed to a particular model of microphone. The plurality of filter equalizing coefficients of the selected profile may be used to configure the graphic equalizer 1300 to equalize signals that are received from the microphone such that the perceived quality of the sound may be enhanced.

There may also be profiles directed to one or more listening environments. For example, there may be a profile directed to clarify the sound of a voice during a telephone conversation, to clarify voice or music in high noise environments, and/or to clarify voice or music environments where the listener is hearing impaired. There may also be separate profiles for different audio content including a profile for signals associated with voice, music, and movies. In one example, there may be different profiles for different types of music (e.g., alternative music, jazz, or classical).

Those skilled in the art will appreciate that the enhancement or clarification of sound may refer to an improved perception of the sound. In various embodiments, the filter equalizing coefficients of the profile may be selected as to improve the perception of sound for a particular device playing a particular audio content (e.g., a movie over a portable media player). The filter equalizing coefficients of the plurality of filter equalizing coefficients in the profile may be selected and/or generated based on a desired sound output and/or quality.

The equalizing module 1306 may configure the filters of the filter module 1302 using the coefficients of the plurality of filter equalizing coefficients in the profile. As discussed herein, the filters of the graphic equalizer 1300 may be implemented via a Mitra-Regalia realization. In one example, once the equalizing module 1306 configures the filters with the filter equalizing coefficients, the coefficients of the filters may remain fixed (i.e., the filters are not reconfigured with new coefficients before, during, or after equalizing multiple signals). Although the filters of the graphic equalizer 1300 may not be reconfigured with new filter equalizing coefficients, the filters may be periodically adjusted with a gain value (e.g., the gain variable). Computing the gain value to further configure the equalizer filters may be accomplished by varying simple quantities as previously discussed.

The equalizing module 1306 may also equalize multiple signals using the filters configured by the filter equalizing coefficients of the profile. In one example, the equalizing module 1306 equalizes a first signal containing multiple frequencies using the previously configured equalizer filters of the filter module 1306. A second signal may also be similarly equalized using the equalizer filters as previously configured by the filter equalizing coefficients. In some embodiments, the equalizing module 1306 adjusts the gain to further configure the equalizer filters before the second signal is equalized.

In some embodiments, the profile may comprise one or more shelf filter coefficients. As discussed herein, one or more shelf filters may comprise first order filters. The one or more shelf filters (e.g., low shelf 1 102, high shelf 1 103, low shelf 2 105, and high shelf 2 106 of FIG. 1) may be configured by the shelf filter coefficient(s) within the profile. In one example, the profile may be directed to a particular built-in speaker of a particular model of computer. In this example, shelf filter coefficients within the profile may be used to configure the shelf filters to improve or enhance sound quality from the built-in speaker. Those skilled in the art will appreciate that the profile may comprise many different filter coefficients that may be used to configure any filter to improve or enhance sound quality. The shelf filters or any filter may be further configured with the gain value as discussed herein.

Those skilled in the art will appreciate that more or less modules may perform the functions of the modules described in FIG. 13. There may be any number of modules. Modules may comprise hardware, software, or a combination of both. Hardware modules may comprise any form of hardware including circuitry. In some embodiments, filter circuitry performs the same or similar functions as the filter module 1302. Profile circuitry may perform the same or similar functions as the profile module 1304 and equalizing circuitry may perform the same or similar functions as the equalizing module 1306. Software modules may comprise instructions that may be stored within a computer readable medium such as a hard drive, RAM, flash memory, CD, DVD, or the like. The instructions of the software may be executable by a processor to perform a method.

Figure 14:
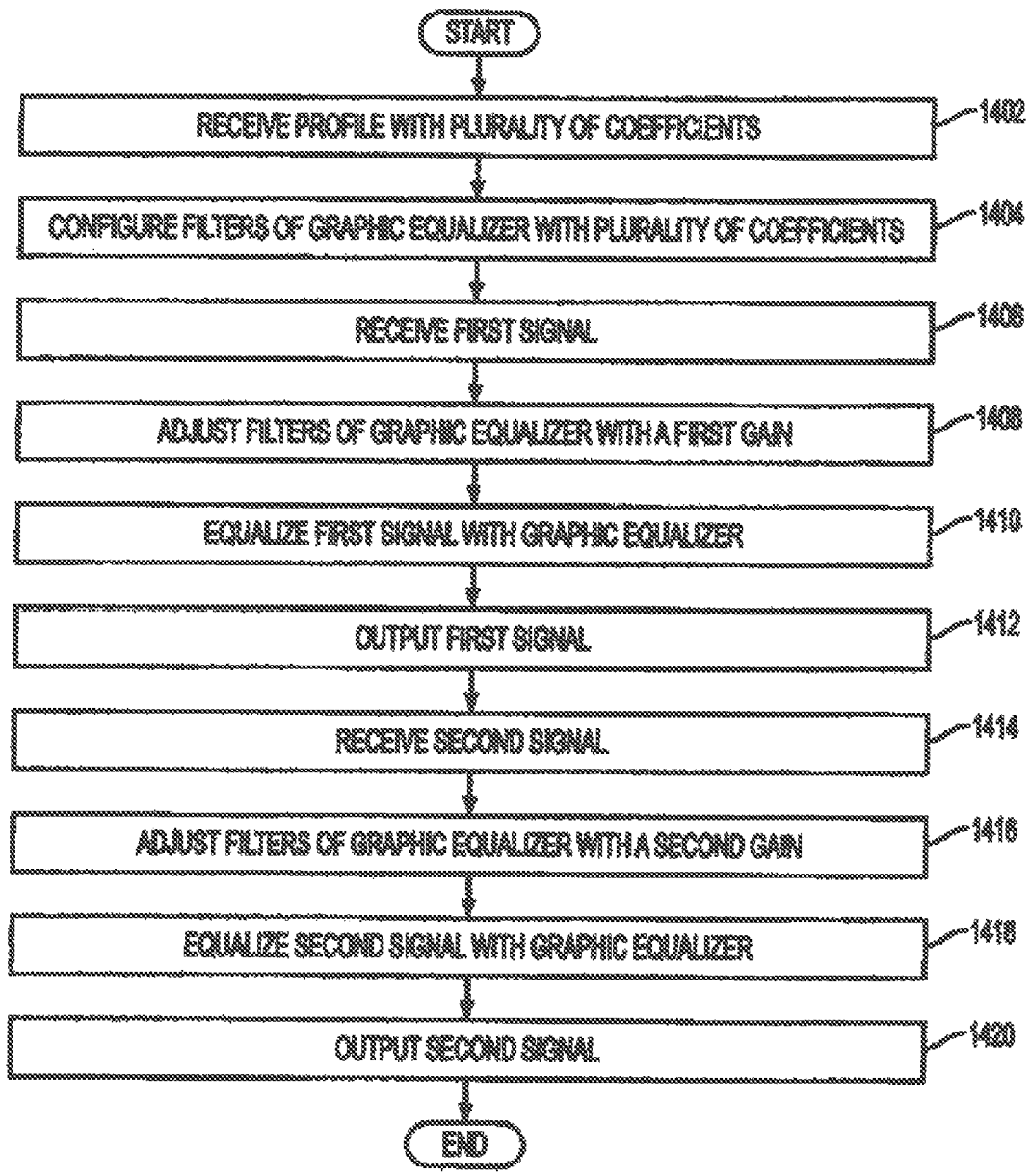
FIG. 14 is a flow chart for configuring a graphic equalizer with a plurality of filter coefficients in one embodiment of the digital signal processing method of the present invention.

FIG. 14 is a flow chart for configuring a graphic equalizer 1300 with a plurality of filter equalizing coefficients in one embodiment of the digital signal processing method of the present invention. In step 1402, the profile module 1304 receives a profile with a plurality of filter equalizing coefficients. In various embodiments, a user of a digital device may select a profile that is associated with available hardware, listening environment, and/or audio content. A digital device is any device with memory and a processor. In some examples, a digital device may comprise a cellular telephone, a corded telephone, a wireless telephone, a music player, media player, a personal digital assistant, e-book reader, laptop, desk computer or the like.

The profile may be previously stored on the digital device (e.g., within a hard drive, Flash memory, or RAM), retrieved from firmware, or downloaded from a communication network (e.g., the Internet). In some embodiments, different profiles may be available for download. Each profile may be directed to a particular hardware (e.g., model and/or type of speaker or headphone), listening environment (e.g., noisy), and/or audio content (e.g., voice, music, or movies). In one example, one or more profiles may be downloaded from a manufacturer and/or a website.

In step 1404, the equalizing module 1306 configures filters of the graphic equalizer 1300 (e.g., equalizer filters of the filter module 1302) with the plurality of filter equalizing coefficients from the profile. The equalizing module 1306 or another module may also configure one or more other filters with other coefficients contained within the profile.

In step 1406, the equalizing module 1306 receives a first signal. The first signal may comprise a plurality of frequencies to be equalized by the preconfigured equalizer filters of the filter module 1302.

In step 1408, the equalizing module 1306 adjusts filters of the graphic equalizer 1300 (e.g., the filters of the filter module 1302) using a first gain (e.g., a first gain value). In some embodiments, the gain is associated with a speaker. The gain may be associated with the desired characteristic of the sound to be stored. Further, the gain may be associated with the first signal. In some embodiments, the equalizing module 1306 adjusts the filter module 1302 prior to receiving the first signal.

In step 1410, the equalizing module 1306 equalizes the first signal. In various embodiments, the equalizing module 1306 equalizes the first signal with the equalizer filters of the filter module 1302 that was configured by the filter equalizing coefficients of the profile and further adjusted by the gain.

The equalizing module 1306 may output the first signal in step 1412. In some embodiments, the first signal may be output to a speaker device or storage device. In other embodiments, the first signal may be output for further processing (e.g., by one or more compressors and/or one or more filters).

In step 1414, the equalizing module 1306 receives the second signal. In step 1416, the equalizing module 1306 adjusts filters of the graphic equalizer 1300 with a second gain. In one example, the equalizing module 1306 further adjusts the filters of the filter module 1302 that were previously configured using the filter equalizing coefficients. The second gain may be associated with the first signal, the second signal, a speaker, or a sound characteristic. In some embodiments, this step is optional.

In step 1418, the equalizing module 1306 equalizes the second signal with the graphic equalizer 1300. In various embodiments, the equalizing module 1306 equalizes the second signal with the equalizer filters of the filter module 1302 that was configured by the filter equalizing coefficients of the profile and further adjusted by the first and/or second gain. The equalizing module 1306 may output the second signal in step 1420.

Those skilled in the art will appreciate that different profiles may be applied during signal processing (e.g., while sound is playing through a speaker). In some embodiments, a user may select a first profile containing filter equalizing coefficients which are used to configure the graphic equalizer 1300 during processing. The change or enhancement caused by the signal processing of the configured graphic equalizer 1300 may be perceptible by a listener. The user may also select a second profile containing different filter equalizing coefficients which are used to reconfigure the graphic equalizer 1300. As discussed herein, the change or enhancement caused by the signal processing of the reconfigured graphic equalizer 1300 may also be perceptible by the listener. In various embodiments, a listener (e.g., user) may select a variety of different profiles during signal processing and listen to the differences. As a result, the listener may settle on a preferred profile.

Figure 15:
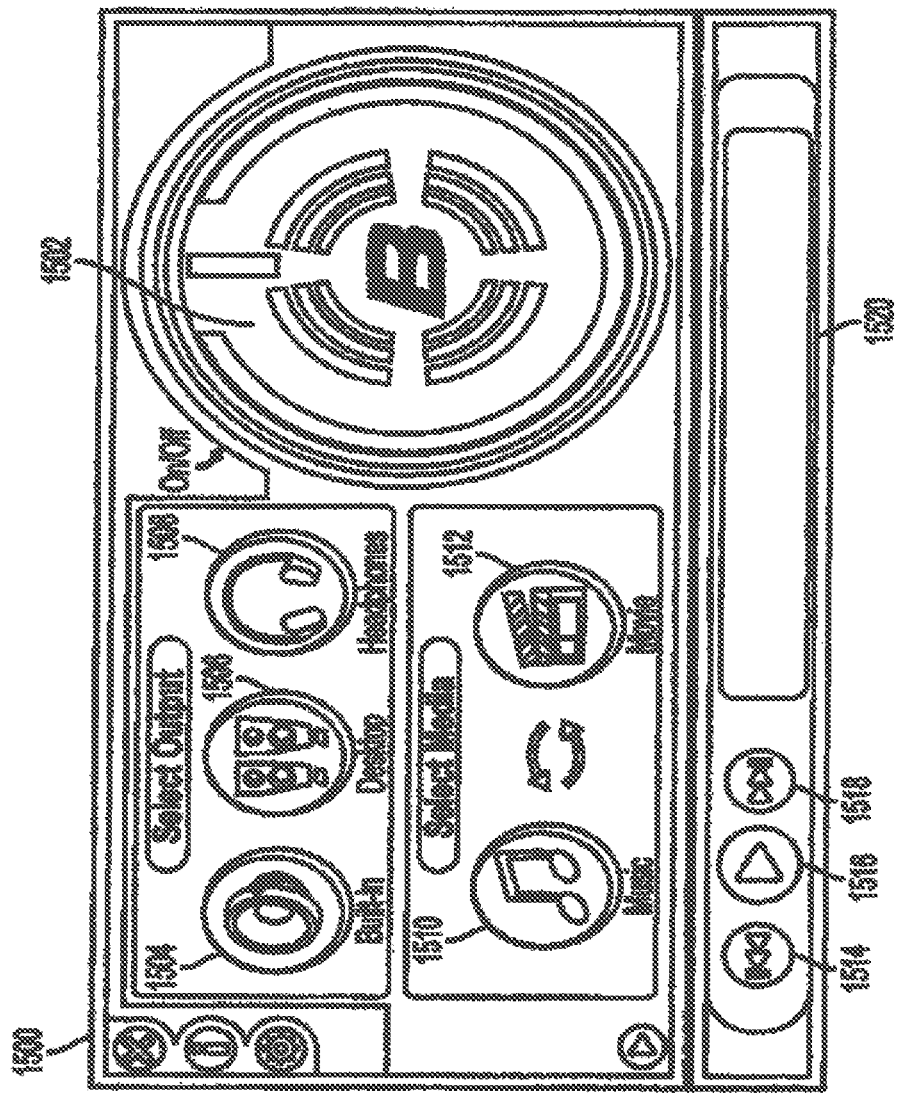
FIG. 15 is an exemplary graphical user interface for selecting one or more profiles to configure the graphic equalizer in one embodiment of the digital signal processing method of the present invention.

FIG. 15 is an exemplary graphical user interface 1500 for selecting one or more profiles to configure the graphic equalizer in one embodiment of the digital signal processing method of the present invention. In various embodiments, the graphical user interface 1500 may be displayed on a monitor, screen, or display on any digital device. The graphical user interface 1500 may be displayed using any operating system (e.g., Apple OS, Microsoft Windows, or Linux). The graphical user interface 1500 may also be displayed by one or more applications such as Apple Itunes.

The graphical user interface 1500 is optional. Various embodiments may be performed on a variety of hardware and software platforms that may or may not use a graphical user interface. In one example, some embodiments may be performed on a RIM Blackberry communication device. In another example, some embodiments may be performed on an application on a computer such as Apple Itunes.

For example, an existing media player or application may be configured (e.g., by downloading a plug-in or other software) to receive the profile and apply the filter equalizing coefficients to a graphic equalizer. In one example, a plug-in for Apple Itunes is downloaded and installed. The user may select music to play. The music signals may be intercepted from Apple Itunes and processed using one or more filters and a graphic equalizer configured by one or more profiles (optionally selected by the user). The processed signals may then be passed back to the application and/or operating system to continue processing or to output to a speaker. The plug-in may be downloaded and/or decrypted before installing. The profile may also be encrypted. The profile, in some embodiments, may comprise a text file. The application may allow the user the option to minimize the application and display the graphical user interface 1500.

In some embodiments, the graphical user interface 1500 displays a virtual media player and a means for the user to select one or more profiles. The on/off button 1502 may activate the virtual media player.

The built-in speaker button 1504, the desktop speaker button 1506, and the headphones button 1508 may each be selectively activated by the user through the graphical user interface 1500. When the user selectively activates the button 1504, the desktop speaker button 1506, or the headphones button 1508, an associated profile may be retrieved (e.g., from local storage such as a hard drive or firmware) or downloaded (e.g., from a communication network). The filter equalizing coefficients of the plurality of coefficients may then be used to configure a graphic equalizer to modify sound output. In one example, the profile associated with the headphones button 1508 comprises filter equalizing coefficients configured to adjust, modify, enhance or otherwise alter output of headphones that may be operatively coupled to the digital device.

The music button 1510 and the movie button 1512 may each be selectively activated by the user through the graphical user interface 1500. Similar to the built-in speaker button 1504, the desktop speaker button 1506, and the headphones button 1508, when the user selectively activates the music button 1510 or the movie button 1512, an associated profile may be retrieved. In some embodiments, the associated profile comprises filter equalizing coefficients that may be used to configure the filters of the graphic equalizer as to adjust, modify, enhance, or otherwise alter sound output.

It will be appreciated by those skilled in the art that multiple profiles may be downloaded and one or more of the filter equalizing coefficients of one profile may work with the filter equalizing coefficients of another profile to improve sound output. For example, the user may select the built-in speaker button 1504 which configures the filters of the graphic equalizer with filter equalizing coefficients from a first profile in order to improve sound output from the built-in speaker. The user may also select the music button 1510 which further configures the filter equalizing coefficients of the graphic equalizer with filter equalizing coefficients from a second profile in order to further improve the sound output of music from the built-in speaker.

In some embodiments, multiple profiles are not combined. For example, the user may select the built-in speaker button 1504 and the music button 1510 which retrieves a single profile comprising filter equalizing coefficients to improve or enhance the sound output of the music from the built-in speaker. Similarly, there may be a separate profile that is retrieved when the user activates the desktop speaker button 1506 and the music button 1510. Those skilled in the art will appreciate that there may be any number of profiles associated with one or more user selections of hardware, listening environment, and/or media type.

The rewind button 1514, the play button 1516, the forward button 1518, and the status display 1520 may depict functions of the virtual media player. In one example, after the user has selected the profiles to be used (e.g., through selecting the buttons discussed herein), the user may play a media file (e.g., music and/or a movie) through the play button 1516. Similarly, the user may rewind the media file using the rewind button 1514 and fast forward the media file using the fast forward button 1518. The status display 1520 may display the name of the media file to the user, as well as associated information about the media file (e.g., artist, total duration of media file, and duration of media file left to play). The status display 1520 may display any information, animation, or graphics to the user.

In various embodiments, a plug-in or application for performing one or more embodiments described herein must be registered before the plug-in or application is fully functional. In one example, a free trial may be downloadable by a user. The trial version may play a predetermined period of time (e.g., 1 minute) of enhanced sound or audio before returning the signal processing to the previous state (e.g., the sound may return to a state before the trial program was downloaded). In some embodiments, the unenhanced sound or audio may be played for another predetermined period (e.g., 1 or 2 minutes) and the signal processing may again return to enhancing the sound quality using the previously configured graphic equalizer and/or other filters. This process may go back and forth through the duration of the song. Once the registration of the plug-in or application is complete, the plug-in or application may be configured to process signals without switching back and forth.

Figure 16:
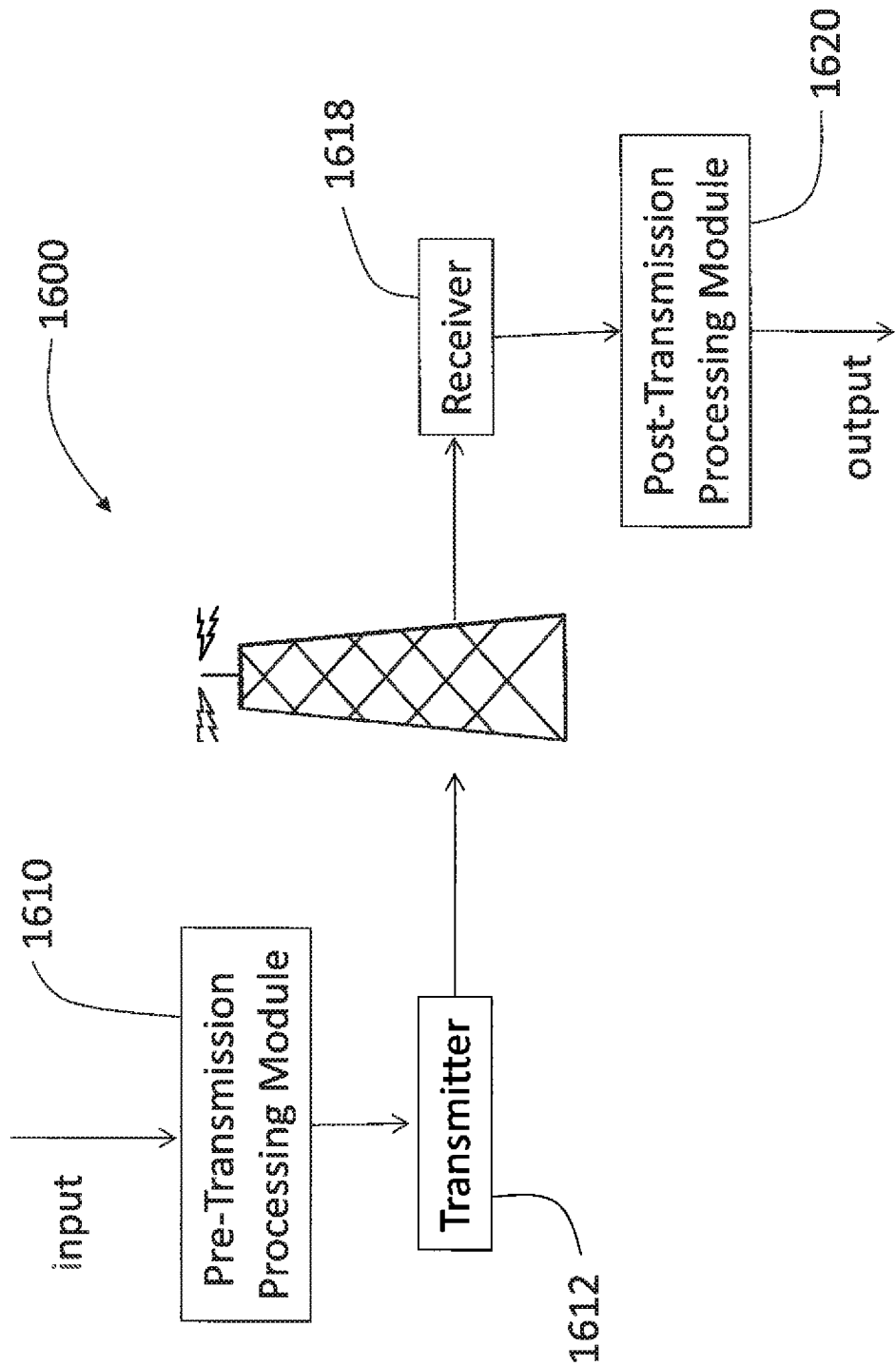
FIG. 16 is a block diagram of yet another embodiment of the present invention comprising a pre-transmission processing module and a post-transmission processing module.

FIG. 16 illustrates yet another embodiment of the system and method described herein. In particular, the embodiment illustrated in FIG. 16 is generally configured for broadcasting or transmission applications 1600, including, but in no way limited to radio broadcast applications, cellular telephone applications, and, in some circumstances, short range transmission within a common vehicle, studio, concert hall, etc. In addition, the transmission of the signal, as described herein, may be carried out via a physical medium, such as, for example, CD, DVD, etc. Other embodiments include transmission via the Internet or other communication networks.

Particularly, the audio signal is transmitted from one location to another, whereby the audio processing is shared or otherwise partially conducted prior to transmission and partially conducted after transmission. In this manner, the receiver or final audio device may finally process the signal to suit the specific audio device, profile or listening environment. For example, in the embodiment wherein a signal is broadcasted or transmitted to a plurality of audio devices or radios, either via radio broadcast, the Internet, DVD, CD, etc., each of the receiving devices may have different configurations, different qualities, different speakers, and be located in different listening environments (e.g., different vehicles, homes, offices, etc.) Thus, at least one embodiment of the present invention is structured and configured to pre-process the signal prior to transmission or broadcasting, and then finish the processing after the signal is transmitted or broadcasted to suit the particular environment. In such a case, the present invention may include a pre-transmission processing module 1610, circuitry or programming, located at the transmitter or signal broadcasting station, and a post-transmission processing module 1620, circuitry or programming, located at or in communicative relation with the receiver, radio, speakers, etc.

Accordingly, the pre-transmission processing module 1610 is structured and configured to at least partially process an audio signal prior to transmission, and the post-transmission processing module 1620 is structured and configured to process the audio signal after transmission, and generate an output signal. In certain embodiments, the configuration of the post-transmission processing module 1620 is dictated by the output audio device hardware specification, a profile as described herein, and/or the particular listening environment.

In certain embodiments, the post-transmission processing module 1620 includes an at least partially inverse configuration relative to the pre-transmission processing module 1610. Specifically, in one embodiment, the pre-transmission processing module 1610 and the pre-transmission processing module 1620 both include shelving filters, e.g., a low shelf filter and a high shelf filter, wherein the filters of the post-transmission processing module include frequency values that are matched or substantially equal to the frequency values of the pre-transmission processing module, but whose gain value are inverse.

In addition, the pre-transmission processing module 1610 of at least one embodiment comprises a dynamic range modification component configured to decrease the dynamic range of the signal, for example, via compression, limiting and/or clipping, as discussed herein, to create an at least partially processed signal. Accordingly, the dynamic range modification component may include a compressor, and in other embodiments, may include a gain amplifier.

Conversely, the post-transmission processing module 1620 of at least one embodiment is configured to increase the dynamic range of the partially processed signal to create an output signal. It should be noted, however, that the gain values of the post-transmission processing module 1620 filters may be adjusted, for example, to compensate for lost bandwidth due to lower data rates during transmission. The gain values may be pre-programmed or pre-designated so maximum audio quality is maintained at all data rates.

Furthermore, the shelving filters of the pre-transmission processing module 1610 of at least one embodiment may be structured and configured to create an approximate 24 dB differential between high and low frequencies. The dynamic range modification component of the pre-transmission processing module 1610 may then be configured to process the signal from the shelving filters and decrease the dynamic range thereof by compression, limiting or clipping. The resultant signal is the partially processed signal that will then be prepared for transmission.

For instance, at least one embodiment further comprises a transmitter 1612 which is configured to transmit the partially processed signal generated by the pre-transmission processing module 1610. The transmitter 1612 may use any transmission or broadcasting technology, including, but in no way limited to radio frequency transmission or broadcast, wireless or wired data transmission via WiFi, BlueTooth, Internet, telecommunication protocols, etc., and/or writing the signal to or embedding the signal on a medium, such as a DVD, CD, etc. Accordingly, in certain embodiments, the partially processed signal may undergo data compression via lossy constant bit rate ("CBR"), average bit rate ("ABR"), variable bit rate ("VRB"), Mp3, or FLAC data compression, for example, for transmission or storage. Of course, other data compression algorithms or schemas may be utilized.

Still referring to FIG. 16, the invention may further include a receiver 1618 for receiving the transmitted signal. In certain embodiments, the transmitted signal may need to be decoded, for instance, wherein the signal was compressed or encoded via data compression prior to transmission. In any event, the receiver 1618 is structured to receive the transmitted signal, decode the transmitted signal (if necessary), and feed the signal to the post-transmission processing module 1620 for further processing, as described herein.

In the embodiment wherein the signal or audio is transmitted via a medium (e.g., a CD or DVD), the transmitter may embed the audio signal on the medium after pre-processing, and the receiver (at the audio player) will read the medium, and, if necessary, decode the signal prior to post-transmission processing.

It should also be noted that the pre-transmission processing module 1610 and the post-transmission processing module 1620 may utilize the same or similar components as those discussed in detail herein, and as shown in FIG. 1. For instance, the pre-transmission processing module 1610 of at least one embodiment comprises an input gain adjust (101), low shelf filter (102), high shelf filter (103) and compressor (104). In such an embodiment, the method of processing a signal with the pre-transmission processing module comprises adjusting a gain of the signal a first time using the pre-transmission processing module, filtering the adjusted signal with a first low shelf filter using the pre-transmission processing module, filtering the signal received from the first low shelf filter with a first high shelf filter using the pre-transmission processing module, and compressing the filtered signal with a first compressor using the pre-transmission processing module. The signal then undergoes data compression for transmission, and is then transmitted to a receiver, where the signal is received, decoded and sent to the post-transmission processing module 1620.

Similarly, the post-transmission processing module 1620 of at least one embodiment may utilize the same or similar components as those discussed in detail herein, and as shown in FIG. 1. For instance, the post-transmission processing module 1620 of at least one embodiment comprises a low shelf filter (105) and high shelf filter (106), a graphic equalizer (107), a compressor (108) and an output gain adjust (109). Thus, the method of processing the signal with the post-transmission processing module 1620 of at least one embodiment comprises filtering the signal with a second low shelf filter using the post-transmission processing module, filtering the signal with a second high shelf filter, using the post-transmission processing module, processing the signal with a graphic equalizer using the post-transmission processing module, compressing the processed signal with a second compressor using the post-transmission processing module, adjusting the gain of the compressed signal a second time using the post-transmission processing module, and outputting the signal.

In yet other embodiments, the output signal may be sent to a transducer for vibrating various materials in order to reproduce sound within the audible range. The transducers in these embodiments are not loudspeakers. Loudspeakers traditionally produce sound by the vibration of a diaphragm within the loudspeaker, usually through a voice coil which converts electrical signals into mechanical force and thereby vibrating the diaphragm.

In these embodiments, the contemplated transducer element does not have an internal diaphragm, and may comprise a surface transducer or a vibration transducer. Alternatively the transducer element may be formed of any electrical circuit and/or mechanical structure capable of vibrating materials, which are not diaphragms of loudspeakers, in order to reproduce sound. The materials contemplated may comprise any size, shape, density, or chemical composition. The materials may include, without limitation, a glass surface such as a window, a wood table, a refrigerator door, a wall, cabinetry, a plastic sheet, or any other surface capable of acoustic resonance.

Variances in material characteristics such as surface area, size, shape, rigidity and density cause them to resonate at different frequencies. Thus, different materials require different power or gain adjustments in different frequencies or frequency ranges in order to reproduce a sonically accurate signal. For example, a dense and non-rigid material such as certain plastics may be able to reproduce low frequencies well, but are resistant to vibrating at higher frequencies. Accordingly, a large increase in high frequency power is required in order to cause the plastic to vibrate, and thereby impart a sound pressure level which accurately depicts the sound signal at these high frequencies. As another example, glass is a dense and rigid material which tends to reproduce higher frequency sounds better than lower frequency sounds, and would therefore require increases in the amount of low frequency gain in order to accurately reproduce the sound signal. The gain of certain frequencies may be increased or decreased accordingly in order to reproduce an accurate sound.

A graphic equalizer 1300, such as that in FIG. 13, may be employed to adjust the gains of certain frequencies of a signal in these embodiments. The graphic equalizer 1300 may be based at least in part on a material profile, which may be received by the profile module 1304. Each material profile may comprise a plurality of filter equalizing coefficients used to configure the filters of the graphic equalizer. A material profile may be based on the type of material (e.g., plastic, metal, wood, glass). A material profile may also be based on physical characteristics of a material (e.g., size, shape, dimension, density, rigidity). In at least some embodiments, a material profile may be customized and configured by a user.

In at least one embodiment, the gain adjustment of select frequencies of a signal may also be performed by the post-transmission processing module 1620, based on a material profile, as in FIG. 16. In other embodiments, other frequency range specific gain control devices, circuits, or elements may be used to adjust a signal based on a material profile. In at least one embodiment, a graphic equalizer 1300 or equivalent frequency range specific gain control device, circuit, or module, may be static and/or preconfigured for a certain material type.

Referring back to the equations above, a first-order shelving filter can be created by applying the equation $$A(z) = \frac{k_2 + k_1(1+k_2)z^{-1} + z^{-2}}{1 + k_1(1+k_2)z^{-1} + k_2 z^{-2}}$$

to the first-order allpass filter A(z), where $$A(z) = \frac{\alpha - z^{-1}}{1 - \alpha z^{-1}}$$

where α is chosen such that $$\alpha = \frac{\left(1 - \sin\left(\frac{2\pi f_c}{F_s}\right)\right)}{\cos\left(\frac{2\pi f_c}{F_s}\right)}$$

where fc is the desired corner frequency and Fs is the sampling frequency. The allpass filter A(z) above corresponds to the difference equation $$y[k] = \alpha x[k] - x[k-1] + \alpha y[k-1].$$

If allpass coefficient α is referred to as allpass_coef and the equation terms are rearranged, the above equation becomes $$y[k] = \text{allpass\_coef}(x[k] + y[k-1]) - x[k-1].$$

This difference equation corresponds to a code implementation of a shelving filter that is detailed below.

One specific software implementation of digital signal processing method 100 will now be detailed.

Input gain adjustment 101 and output gain adjustment 109, described above, may both be accomplished by utilizing a "scale" function, implemented as follows:

```
void scale(gain, float *input, float *output)
{
    for (i = 0; i < NSAMPLES; i++)
    {
        *output++ = inputGain * (*input++);}
}
```

First low shelf filter 102 and second low shelf filter 105, described above, may both be accomplished by utilizing a "low shelf" function, implemented as follows:

```
void low_shelf(float *xv, float *yv, float *wpt, float *input,
float *output)
{
    float l;
    int i;
    for (i = 0; i < NSAMPLES; i++)
    {
        if (wpt[2] < 0.0) \\ cut mode, use conventional
realization
        { \\ allpass_coef = alpha
            yv[0] = ap_coef * (*input) + (ap_coef *
            ap_coef - 1.0) * xv[0];
            xv[0] = ap_coef * xv[0] + *input;
            *output++ = 0.5 * ((1.0 + wpt[0]) * (*input++) +
            (1.0 - wpt[0]) * yv[0]);
        }
        else \\ boost mode, use special realization
        {
            l = (ap_coef * ap_coef - 1.0) * xv[0];
            *output = wpt[1] * ((*input++) - 0.5 * (1.0 -
wpt[0]) * l);
            xv[0] = ap_coef * xv[0] + *output++;
        }
    }
}
```

As this function is somewhat complicated, a detailed explanation of it is proper. First, the function declaration provides:

void low_shelf (float*xv, float*yv, float*wpt, float*input, float*output)

The "low_shelf" function takes as parameters pointers to five different floating-point arrays. The arrays xv and yv contain the "x" and "y" state variables for the filter. Because the shelving filters are all first-order filters, the state-variable arrays are only of length one. There are distinct "x" and "y" state variables for each shelving filter used in digital signal processing method 100. The next array used is the array of filter coefficients "wpt" that pertain to the particular shelving filter. wpt is of length three, where the elements wpt[0], wpt[1], and wpt[2] describe the following:

$$wpt[0] = G$$

$$wpt[1] = 2[(1+G)+\alpha(1-G)]^{-1}$$

$$wpt[2] = -1 \text{ when cutting, 1 when boosting}$$

and α is the allpass coefficient and G is the shelving filter gain. The value of α is the same for all shelving filters because it is determined solely by the corner frequency (it should be noted that and all four of the shelving filters in digital signal processing method 100 have a corner frequency of 1 kHz). The value of G is different for each of the four shelving filters.

The array "input" is a block of input samples that are fed as input to each shelving filter, and the results of the filtering operation are stored in the "output" array.

The next two lines of code,

Float l;
  int i;

allocate space for a loop counter variable, i, and an auxiliary quantity, l, which is the quantity 10[k] from FIG. 9.

The next line of code, for (i=0; i<NSAMPLES; i++)

performs the code that follows a total of NSAMPLES times, where NSAMPLES is the length of the block of data used in digital signal processing method 100.

This is followed by the conditional test if (wpt[2]<0,0)

and, recalling the equations discussed above, wpt[2]<0 corresponds to a shelving filter that is in "cut" mode, whereas wpt[2]>=0 corresponds to a shelving filter that is in "boost" mode. If the shelving filter is in cut mode the following code is performed:

```
if (wpt[2] < 0.0) \\ cut mode, use conventional realization
{ \\ allpass_coef = alpha
    yv[0] = ap_coef * (*input) + (ap_coef * ap_coef - 1.0) *
xv[0];
    xv[0] = ap_coef * xv[0] + *input;
    *output++ = 0.5 * ((1.0 + wpt[0]) * (*input++) +
    (1.0 - wpt[0]) * yv[0]);
}
```

The value xv[0] is simply the state variable x[k] and yv[0] is just yv[k]. The code above is merely an implementation of the equations $$y[k] = \alpha \cdot \text{in}[k] + (\alpha^2 - 1) \cdot x[k]$$

$$x[k] = \alpha \cdot x[k] + \text{in}[k]$$

$$\text{out}[k] = \frac{1}{2}((1+G) \cdot \text{in}[k] + (1-G) \cdot y[k])$$

If the shelving filter is in cut mode the following code is performed:

```
else \\ boost mode, use special realization
{
    l = (ap_coef * ap_coef - 1.0) * xv[0];
    *output = wpt[1] * ((*input++) - 0.5 * (1.0 - wpt[0]) * l);
    xv[0] = ap_coef * xv[0] + *output++;
}
``` which implements the equations $$i_0[k] = (\alpha^2 - 1) \cdot x[k]$$

$$\text{out}[k] = 2[(1+G) + \alpha(1-G)]^{-1} \cdot \text{in}[k] - \frac{1}{2}(1-G)i_0[k]$$

$$x[k] = \alpha \cdot x[k-1] + \text{out}[k]$$

First high shelf filter 103 and second high shelf filter 106, described above, may both be accomplished by utilizing a "high_shelf" function, implemented as follows:

```
void high_shelf(float *xv, float *yv, float *wpt, float *input,
float *output)
{
    float l;
    int i;
    for (i = 0; i < NSAMPLES; i++)
    {
```

```
        if (wpt[2] < 0.0) \\ cut mode, use conventional
realization,
        { \\ allpass_coef = alpha
            yv[0] = allpass_coef * (*input) + (allpass_coef *
            allpass_coef - 1.0) *
            xv[0];
            xv[0] = allpass_coef * xv[0] + *input;
            *output++ = 0.5 * ((1.0 + wpt[0]) * (*input++) -
            (1.0 - wpt[0]) * yv[0]);
        }
        else \\ boost mode, use special realization
        {
            l = (allpass_coef * allpass_coef - 1.0) * xv[0];
            *output = wpt[1] * ((*input++) + 0.5 * (1.0 -
wpt[0]) * l);
            xv[0] = allpass_coef * xv[0] + *output++;
        }
    }
}
```

Implementing the high-shelving filter is similar to implementing the low-shelving filter. Comparing the two functions above, the only substantive difference is in the sign of a single coefficient. Therefore, the program flow is identical.

Graphic equalizer 107, described above, may be implemented using a series of eleven calls to a "bell" filter function, implemented as follows:

```
void bell(float *xv, float *yv, float *wpt, float *input, float
*output)
{
    float geq_gain = wpt[0]; \\ G
    float geq_b0 = wpt[1]; \\ k2
    float geq_b1 = wpt[2]; \\ k1(1+k2)
    float ap_output;
    int i;
    for (i = 0; i < NSAMPLES; i++)
    {
        ap_output = geq_b0 * (*input - yv[0]) + geq_b1 *
        (xv[1] - yv[1]) + xv[0];
        xv[0] = xv[1]; \\ update
        xv[1] = * input; \\ update
        yv[0] = yv[1]; \\update
        yv[1] = *output; \\update
        *output++ = 0.5 * (1.0-gain) * ap_output + 0.5 *
        (1.0+gain) * (*input++);
    }
}
```

The function bell( ) takes as arguments pointers to arrays xv (the "x" state variables), yv (the "y" state variables), wpt (which contains the three graphic EQ parameters G, k2, and k1(1+k2)), a block of input samples "input", and a place to store the output samples. The first four statements in the above code snippet are simple assignment statements and need no explanation.

The for loop is executed NSAMPLES times, where NSAMPLES is the size of the block of input data. The next statement does the following:

$$ap_{output} = geq_{b0} * (*input - yv[0]) + geq_{b1} * (xv[1] - yv[1]) + xv[0]$$

The above statement computes the output of the allpass filter as described above. The next four statements do the following:

$$xv[0] = xv[1];$$

shifts the value stored in x[k−1] to x[k−2].

$$xv[1] = *input;$$

shifts the value of input[k] to x[k−1].

$$yv[0] = yv[1];$$

shifts the value stored in y[k−1] to y[k−2].

$$yv[1] = *output;$$

shifts the value of output[k], the output of the allpass filter, to y[k−1].

Finally, the output of the bell filter is computed as $$*output++=0.5*(1.0-gain)*ap\_output+0.5*(1.0+gain)$$
$$*(*input++);$$

First compressor 104 and second compressor 108, described above, may be implemented using a "compressor" function, implemented as follows:

```
void compressor(float *input, float *output, float *wpt, int
index)
{
    static float level;
    float interp, GR, excessGain, L, invT, ftempabs;
    invT = wpt[2];
    int i, j;
    for (i = 0; i < NSAMPLES; i++)
    {
        ftempabs = fabs(*input++);
        level = (ftempabs >= level)? wpt[0] * (level -
        ftempabs) + ftempabs : wpt[1] * (level - ftempabs) +
        ftempabs;
        GR = 1.0;
        if (level * invT > 1.0)
        {
            excessGain = level *invT;
            interp = excessGain - trunc(excessGain);
            j = (int) trunc(excessGain) - 1;
            if (j < 99)
            {
                GR = table[index][j] + interp *
                (table[index][j+1] - table[index][j]);
                // table[ ][ ] is the exponentiation table
            }
            else
            {
                GR = table[index][99];
            }
        }
        *output++ = *input++ * GR;
    }
}
```

The compressor function takes as input arguments pointers to input, output, and wpt arrays and an integer, index. The input and output arrays are used for the blocks of input and output data, respectively. The first line of code, static float level;

allocates static storage for a value called "level" which maintains the computed signal level between calls to the function. This is because the level is something that needs to be tracked continuously, for the entire duration of the program, not just during execution of a single block of data.

The next line of code, float interp, GR, excessGain, L, invT, ftempabs;

allocates temporary storage for a few quantities that are used during the computation of the compressor algorithm; these quantities are only needed on a per-block basis and can be discarded after each pass through the function.

The next line of code, $$invT=wpt[2];$$

extracts the inverse of the compressor threshold, which is stored in wpt[2], which is the third element of the wpt array. The other elements of the wpt array include the attack time, the release time, and the compressor ratio.

The next line of code indicates that the compressor loop is repeated NSAMPLES times. The next two lines of code implement the level computation level=(ftempabs>=level)?*wpt[0]*
(level·about·ftempabs)+ftempbas:*wpt[1]*-*(level-ftempabs)+ftempabs;

which is equivalent to the expanded statement

```
if (ftempabs >= level)
{
    level = wpt[0] * (level – ftempabs) + ftempabs;
}
else
{
    level = wpt[1] * (level – ftempabs) + ftempabs;
}
``` which is what is needed to carry out the above necessary equation, with wpt[0] storing the attack constant $\alpha_{att}$ and wpt[1] storing the release constant $\alpha_{rel}$.

Next, it can be assumed that the gain reduction, GR, is equal to unity. Then the comparison if (level*invT>1.0)

is performed, which is the same thing as asking if level >T, i.e., the signal level is over the threshold. If it is not, nothing is done. If it is, the gain reduction is computed. First, the excess gain is computed as excessGain=level*invT;

as calculated using the equations above. The next two statements, interp=excessGain−trunc(excessGain);

j=(int)trunc(excessGain)−1;

compute the value of index into the table of exponentiated values, as per the equations above. The next lines,

```
if (j < 99)
{
    GR = table[index][j] + interp * (table[index][j+1] –
    table[index][j]); // table[ ][ ] is the exponentiation
    table
}
else
{
    GR = table[index][99];
}
``` implement the interpolation explained above. The two-dimensional array, "table," is parameterized by two indices: index and j. The value j is simply the nearest integer value of the excess gain. The table has values equal to $$\text{table}[\text{index}][j] = (j)^{\frac{1-\text{index}}{\text{index}}}$$

which can be recognized as the necessary value from the equations above, where the "floor" operation isn't needed because j is an integer value. Finally, the input is scaled by the computed gain reduction, GR, as per

*output++=*input++*GR;

and the value is written to the next position in the output array, and the process continues with the next value in the input array until all NSAMPLE values in the input block are exhausted.

It should be noted that in practice, each function described above is going to be dealing with arrays of input and output data rather than a single sample at a time. This does not change the program much, as hinted by the fact that the routines above were passed their inputs and outputs by reference. Assuming that the algorithm is handed a block of NSAMPLES in length, the only modification needed to incorporate arrays of data into the bell-filter functions is to incorporate looping into the code as follows:

```
void bell(float *xv, float *yv, float gain, float *input, float
*output)
{
    float ap_output;
    int i;
    for (i = 0; i < NSAMPLES; i++)
    {
        ap_output = geq_b0 * (*input – yv[0]) + geq_b1 *
        (xv[1] – yv[1]) + xv[0] xv[0] = xv[1]; \\ update
        xv[1] = *input; \\ update
        yv[0] = yv[1]; \\update
        yv[1] = *output; \\update
        *output++ = 0.5 * (1.0–gain) * ap_output + 0.5 *
        (1.0+gain) * (*input++);
    }
}
```

Digital signal processing method 100 as a whole, may be implemented as a program that calls each of the above functions, implemented as follows:

```
// it is assumed that floatBuffer contains a block of
// NSAMPLES samples of floating-point data.
// The following code shows the instructions that
// are executed during a single pass
scale(inputGain, floatBuffer, floatBuffer);
low_shelf(xv1_ap, yv1_ap, &working_table[0], floatBuffer,
floatBuffer);
high_shelf(xv2_ap, yv2_ap, &working_table[3], floatBuffer,
floatBuffer);
compressor(floatBuffer, floatBuffer, &working_table[6],
ratio1Index);
low_shelf(xv3_ap_left, yv3_ap_left, xv3_ap_right, yv3_ap_right,
&working_table[11], floatBuffer, floatBuffer);
high_shelf(xv4_ap_left, yv4_ap_left, xv4_ap_right, yv4_ap_right,
&working_table[14], floatBuffer, floatBuffer);
bell(xv1_geq, yv1_geq, &working_table[17], floatBuffer,
floatBuffer);
bell(xv2_geq, yv2_geq, &working_table[20], floatBuffer,
floatBuffer);
bell(xv3_geq, yv3_geq, &working_table[23], floatBuffer,
floatBuffer);
bell(xv4_geq, yv4_geq, &working_table[26], floatBuffer,
floatBuffer);
bell(xv5_geq, yv5_geq, &working_table[29], floatBuffer,
floatBuffer);
bell(xv6_geq, yv6_geq, &working_table[32], floatBuffer,
floatBuffer);
bell(xv7_geq, yv7_geq, &working_table[35], floatBuffer,
floatBuffer);
bell(xv8_geq, yv8_geq, &working_table[38], floatBuffer,
floatBuffer);
bell(xv9_geq, yv9_geq, &working_table[41], floatBuffer,
floatBuffer);
bell(xv10_geq, yv10_geq, &working_table[44], floatBuffer,
floatBuffer);
bell(xv11_geq, yv11_geq, &working_table[47], floatBuffer,
floatBuffer);
compressor(floatBuffer, floatBuffer, &working_table[50],
ratio1Index);
scale(outputGain, floatBuffer, floatBuffer);
```

As can be seen, there are multiple calls to the scale function, the low_shelf function, the high_shelf function, the bell function, and the compressor function. Further, there are references to arrays called xv1, yv1, xv2, yv2, etc. These arrays are state variables that need to be maintained between calls to the various routines and they store the internal states of the various filters in the process. There is also repeated reference to an array called working_table. This table holds the various pre-computed coefficients that are used throughout the algorithm. Algorithms such as this embodiment of digital signal processing method 100 can be subdivided into two parts: the computation of the coefficients that are used in the real-time processing loop and the real-time processing loop itself. The real-time loop consists of simple multiplications and additions, which are simple to perform in real-time, and the coefficient computation, which requires complicated transcendental functions, trigonometric functions, and other operations, which cannot be performed effectively in real-time. Fortunately, the coefficients are static during run-time and can be pre-computed before real-time processing takes place. These coefficients can be specifically computed for each audio device in which digital signal processing method 100 is to be used. Specifically, when digital signal processing method 100 is used in a mobile audio device configured for use in vehicles, these coefficients may be computed separately for each vehicle the audio device may be used in to obtain optimum performance and to account for unique acoustic properties in each vehicle such as speaker placement, passenger compartment design, and background noise.

For example, a particular listening environment may produce such anomalous audio responses such as those from standing waves. For example, such standing waves often occur in small listening environments such as an automobile. The length of an automobile, for example, is around 400 cycles long. In such an environment, some standing waves are set up at this frequency and some below. Standing waves present an amplified signal at their frequency, which may present an annoying acoustic signal. Vehicles of the same size, shape, and of the same characteristics, such as cars of the same model, may present the same anomalies due to their similar size, shape, structural make-up, speaker placement, speaker quality, and speaker size. The frequency and amount of adjustment performed, in a further embodiment, may be configured in advance and stored for use in graphic equalizer 107 to reduce anomalous responses for future presentation in the listening environment.

The "working tables" shown in the previous section all consist of pre-computed values that are stored in memory and retrieved as needed. This saves a tremendous amount of computation at run-time and allows digital signal processing method 100 to run on low-cost digital signal processing chips.

It should be noted that the algorithm as detailed in this section is written in block form. The program described above is simply a specific software embodiment of digital signal processing method 100, and is not intended to limit the present invention in any way. This software embodiment may be programmed upon a computer chip for use in an audio device such as, without limitation, a radio, MP3 player, game station, cell phone, television, computer, or public address system. This software embodiment has the effect of taking an audio signal as input, and outputting that audio signal in a modified form.

While various embodiments of the present invention have been described above, it should be understood that they have been presented by way of example only, and not of limitation. Likewise, the various diagrams may depict an example architectural or other configuration for the invention, which is done to aid in understanding the features and functionality that can be included in the invention. The invention is not restricted to the illustrated example architectures or configurations, but the desired features can be implemented using a variety of alternative architectures and configurations. Indeed, it will be apparent to one of skill in the art how alternative functional, logical, or physical partitioning and configurations can be implemented to implement the desired features of the present invention. In addition, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

Now that the invention has been described,

What is claimed is:

1. A method for processing a signal comprising:
filtering the signal with a first low shelf filter;
filtering the signal received from the first low shelf filter with a first high shelf filter;
compressing the filtered signal with a first compressor;
filtering the compressed signal with a second low shelf filter;
filtering the signal received from the second low shelf filter with a second high shelf filter;
processing the filtered signal with a graphic equalizer based at least in part on a material profile;

compressing the processed signal with a second compressor;
outputting the signal to a transducer.

2. The method as recited in claim 1 wherein the transducer is not a loudspeaker.

3. The method as recited in claim 1 wherein said graphic equalizer is configured to selectively adjust the gain of different frequencies of the filtered signal based on said material profile.

4. The method as recited in claim 3 wherein the material profile comprises material characteristics.

5. The method as recited in claim 4 wherein the material characteristics comprise surface area, size, shape, rigidity, density, or type of material.

6. The method as recited in 1 wherein the first low shelf filter and high shelf filter are configured to create an approximate 24 dB differential between high and low frequencies in the signal.

7. The method as recited in claim 1 wherein the second low shelf filter and high shelf filter comprise gain values which are at least partially inverse relative to the gain values of the first low shelf and high shelf filter.

8. The method as recited in claim 1 wherein the second low shelf filter and high shelf filter comprise frequency values which are approximately equal to frequency values of the first low shelf filter and high shelf filter.

9. A method for processing a signal comprising:
filtering the signal with a first low shelf filter, using a pre-transmission processing module;
filtering the signal received from the first low shelf filter with a first high shelf filter, using the pre-transmission processing module;
compressing the filtered signal with a first compressor, using the pre-transmission processing module;
transmitting the signal;
receiving the transmitted signal;
filtering the signal with a second low shelf filter, using a post-transmission processing module;
filtering the signal with a second high shelf filter, using the post-transmission processing module;
processing the filtered signal with a graphic equalizer based at least in part on a material profile, using the post-transmission processing module;
compressing the processed signal with a second compressor, using the post-transmission processing module;
outputting the signal to a transducer.

10. The method as recited in claim 9 wherein the transducer is not a loudspeaker.

11. The method as recited in claim 9 wherein said graphic equalizer is configured to selectively adjust the gain of different frequencies of the filtered signal based on said material profile.

12. The method as recited in claim 11 wherein the material profile comprises surface area, size, shape, rigidity, density, type of material, and any combinations thereof.

13. An audio system comprising:
a first low shelf filter configured to filter a signal;
a first high shelf filter configured to filter the signal received from said first low shelf filter;
a first compressor configured to compress the filtered signal;
a second low shelf filter configured to filter the compressed signal;
a second high shelf filter configured to filter the signal received from said second low shelf filter;
a graphic equalizer configured to process the filtered signal based at least in part on a material profile;
a second compressor configured to compress the processed signal, and
a transducer configured to output the signal.

14. The audio system as recited in claim 13 further comprising a transmitter structured to transmit the compressed signal received from said first compressor.

15. The audio system as recited in claim 14 further comprising a receiver structured to receive the compressed signal transmitted from said transmitter, the receiver further structured to send the compressed signal to the second low shelf filter.

16. The audio system as recited in claim 13 wherein said transducer is structured to vibrate a material in order to reproduce sound, the material is not a diaphragm of a loudspeaker.

17. The audio system as recited in claim 14 wherein said graphic equalizer is configured to selectively adjust the gain of different frequencies of the filtered signal based on said material profile.

18. The audio system as recited in claim 17 wherein said material profile comprises material characteristics.

19. The audio system as recited in claim 18 wherein said material characteristics comprise surface area, size, shape, rigidity, density, or type of material.

20. The audio system as recited in claim 14 wherein said first low shelf filter and high shelf filter are configured to create an approximate 24 dB differential between high and low frequencies in the signal.

21. The audio system as recited in claim 14 wherein said second low shelf filter and high shelf filter comprise gain values which are at least partially inverse relative to the gain values of said first low shelf and high shelf filter.

22. The audio system as recited in claim 14 wherein said second low shelf filter and high shelf filter comprise frequency values which are approximately equal to frequency values of said first low shelf filter and high shelf filter.

* * * * *